United States Patent
Ray et al.

(10) Patent No.: US 12,406,120 B2
(45) Date of Patent: Sep. 2, 2025

(54) MULTICYCLE PATH PREDICTION OF RESET SIGNALS

(71) Applicant: Synopsys, Inc., Mountain View, CA (US)

(72) Inventors: Baijayanta Ray, Bangalore (IN); Alexander Rabinovitch, Shrewsbury, MA (US); Manish Shroff, Milford, MA (US)

(73) Assignee: Synopsys, Inc., Sunnyvale, CA (US)

( * ) Notice: Subject to any disclaimer, the term of this patent is extended or adjusted under 35 U.S.C. 154(b) by 560 days.

(21) Appl. No.: 17/954,159

(22) Filed: Sep. 27, 2022

(65) Prior Publication Data
US 2024/0104279 A1    Mar. 28, 2024

(51) Int. Cl.
| | |
|---|---|
| G06F 30/3312 | (2020.01) |
| G06F 30/3308 | (2020.01) |
| G06F 30/367 | (2020.01) |
| G06F 30/373 | (2020.01) |
| G06F 30/398 | (2020.01) |

(52) U.S. Cl.
CPC ...... *G06F 30/3312* (2020.01); *G06F 30/3308* (2020.01); *G06F 30/367* (2020.01); *G06F 30/373* (2020.01); *G06F 30/398* (2020.01)

(58) Field of Classification Search
CPC ............ G06F 30/3312; G06F 30/3308; G06F 30/367; G06F 30/373; G06F 30/398
USPC .... 716/108, 106, 111, 136, 134; 703/16, 19, 703/28
See application file for complete search history.

(56) References Cited

U.S. PATENT DOCUMENTS

| | | | | |
|---|---|---|---|---|
| 9,875,330 | B2* | 1/2018 | Ganusov | G06F 30/343 |
| 9,934,342 | B1* | 4/2018 | Huang | G06F 30/327 |
| 2008/0288901 | A1* | 11/2008 | Barowski | G06F 30/3323 |
| | | | | 716/108 |
| 2013/0166269 | A1* | 6/2013 | Narita | G06F 30/3312 |
| | | | | 703/14 |
| 2014/0132315 | A1* | 5/2014 | Sharma | G01R 31/2884 |
| | | | | 327/142 |
| 2021/0157356 | A1* | 5/2021 | Sarda | H03K 5/1565 |

(Continued)

FOREIGN PATENT DOCUMENTS

JP         H1097557 A  *  4/1998 ............ G06F 30/32

OTHER PUBLICATIONS

Hsieh et al., Chinese Patent Document No. CN-113268941-A, published Aug. 17, 2021, 3 pages including abstract and claims. (Year: 2021).*

*Primary Examiner* — Phallaka Kik
(74) *Attorney, Agent, or Firm* — Patterson + Sheridan, LLP

(57) ABSTRACT

A system and method for emulation receives a circuit design driven by a primary clock signal. The circuit design includes reset circuitry and sequential circuitry connected to the reset circuitry. The circuit design includes a secondary clock signal that is slower than the primary clock signal. The reset circuitry generates a reset signal that is a function of the secondary clock signal. The secondary clock signal is remodeled at a transition edge of the primary clock signal, and a predicted reset signal is generated subsequent to the reset signal at the transition edge of the primary clock signal. An operation of the circuit design is emulated based on the predicted reset signal such that the predicted reset signal from the reset circuitry propagates through multiple cycles of the primary clock signal.

20 Claims, 9 Drawing Sheets

(56) References Cited

U.S. PATENT DOCUMENTS

| | | | |
|---|---|---|---|
| 2022/0149844 A1* | 5/2022 | Arcidiacono | H03K 5/153 |
| 2022/0334842 A1* | 10/2022 | Huang | H03K 3/037 |
| 2023/0066399 A1* | 3/2023 | Nagao | G06F 1/08 |
| 2023/0195982 A1* | 6/2023 | Rabinovitch | G06F 30/3312 |
| | | | 716/101 |
| 2023/0409788 A1* | 12/2023 | Biswas | G06F 9/522 |

\* cited by examiner

MULTICYCLE PATH PREDICTION OF RESET SIGNALS

TECHNICAL FIELD

The present disclosure generally relates to a circuit emulation system. In particular, the present disclosure relates to a system and method for providing multicycle path prediction of reset signals in a circuit design emulation or prototyping system.

BACKGROUND

Circuit designs are emulated, or prototyped, to test the functionality of the circuit designs. Emulation is performed at the granularity of discrete clock cycles of a clock signal or signals. A circuit design may include multiple clock signals and data paths connecting circuit elements of the circuit design, and reset signals that reset the state of the circuit elements. The clock signals are based on a root clock signal (e.g., driver clock signal), and are slower than the root clock signal.

SUMMARY

In one example a method includes receiving a circuit design driven by a primary clock signal. The circuit design includes reset circuitry and sequential circuitry connected to the reset circuitry. The circuit design includes a secondary clock signal that is slower than the primary clock signal. The reset circuitry generates a reset signal that is a function of the secondary clock signal. The method further includes remodeling the secondary clock signal at a transition edge of the primary clock signal, and generating a predicted reset signal subsequent to the reset signal at the transition edge of the primary clock signal. Further, the method includes emulating an operation of the circuit design based on the predicted reset signal such that the predicted reset signal from the reset circuitry propagates through multiple cycles of the primary clock signal.

A system includes a memory and a processor. The memory stores instructions. The processor is coupled with the memory and executes the instructions. The instructions when executed cause the processor to receive a circuit design including reset circuitry and sequential circuitry connected to the reset circuitry. The circuit design includes a secondary clock signal, and the reset circuitry generates a reset signal that is a function of the secondary clock signal. The processor remodels the secondary clock signal at a transition edge of primary clock signal. The secondary clock signal is slower than the primary clock signal. Further, the processor generates a predicted reset signal subsequent to the reset signal at the transition edge of the primary clock signal. The processor further emulates an operation of the circuit design based on the predicted reset signal such that the predicted reset signal from the reset circuitry propagates through multiple cycles of the primary clock signal.

In one example, an emulation system includes a compiler and one or more processors. The compiler receives a circuit design including reset circuitry and sequential circuitry connected to the reset circuitry. The circuit design includes a secondary clock signal, and the reset circuitry generates a reset signal that is a function of the secondary clock signal. The compiler further remodels the secondary clock signal at a transition edge of a primary clock signal. The secondary clock signal is slower than the primary clock signal. The one or more processors receive the circuit design including the remodeled secondary clock signal, and generate a predicted reset signal subsequent to the reset signal at the transition edge of the primary clock signal. Further, the one or more processors emulate an operation of the circuit design based on the predicted reset signal such that the predicted reset signal from the reset circuitry propagates through multiple cycles of the primary clock signal.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Figure 1:
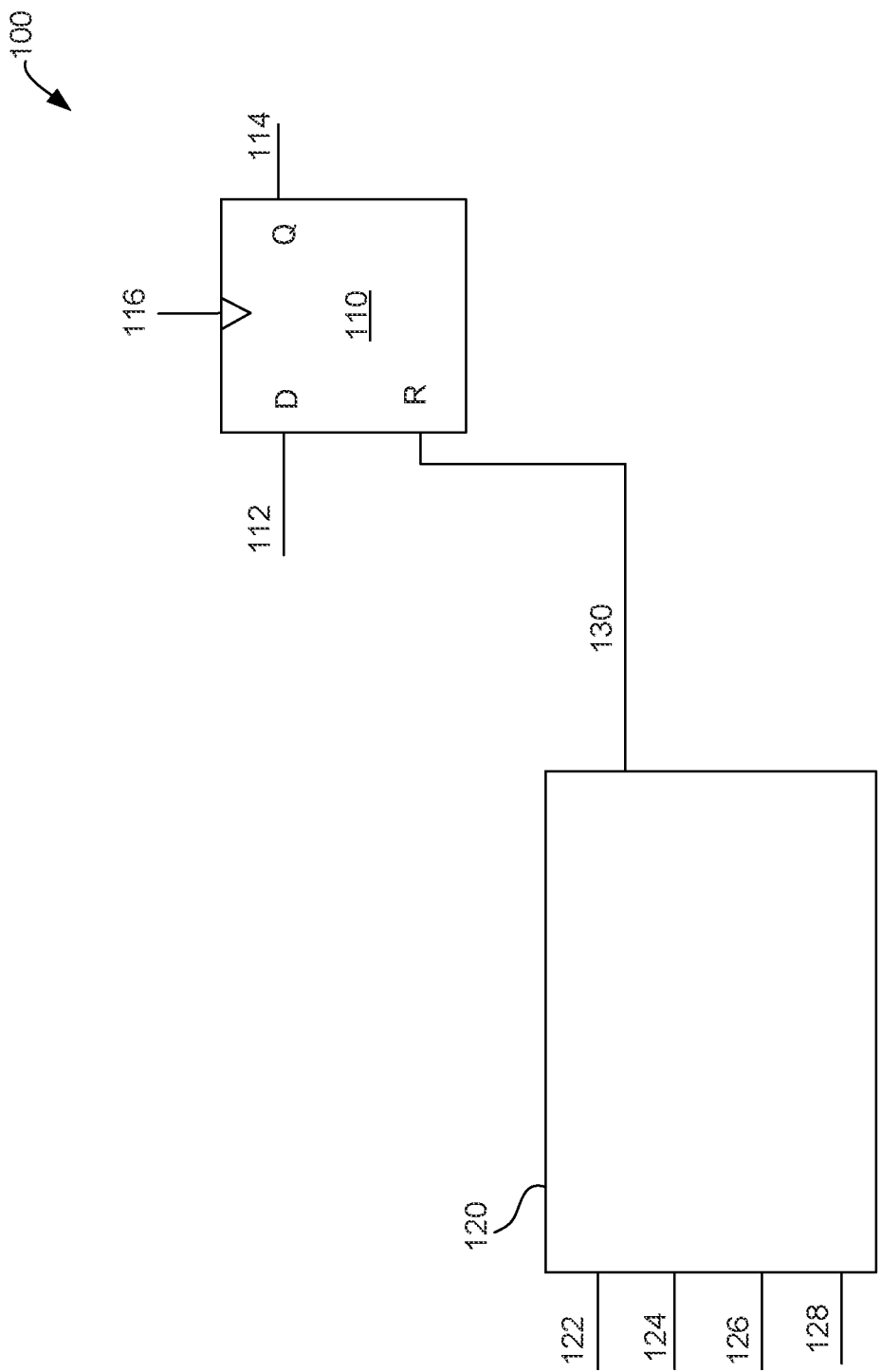
FIG. 1 illustrates a circuit design having a sequential circuit element driven by a reset signal of a reset logic cone in accordance with some embodiments of the present disclosure.

Aspects of the present disclosure relate to multicycle path prediction of reset signals.

In the following, a system and method for performing prediction of a reset signal within an emulation or prototyping system of a circuit design is described. Generally, during the emulation process, prediction is applied to clock signals to determine a value of the clock signal for a cycle of a driver clock signal (e.g., root clock signal or emulation signal). The driver clock signal is the fastest clock signal (e.g., has the highest frequency). The predicted clock signal, is used as the clock enable signal for the circuit elements within the data path. The clock enable signal is generated from the driver clock signal. The clock enable signal is driven for multiple cycles of the driver clock signal, as determined by the ratio of the frequency of the driver clock signal to the clock enable signal that is generating the data path signal used to route the data paths. In many instances, reset signals are generated directly from a reset logic cone and driven onto a sequential circuit element, and prediction is not used to predict a value of the reset signals. Reset signals drive circuit element or elements that are sequential to the corresponding reset circuitry. In such instances, as prediction is not applied to the reset signals, the reset path of a sequential circuit element is a performance bottleneck in emulation. Further, since the value of reset signal is directly used without prediction, any glitch in the reset signal can directly cause a glitch in the design and lead to functional issues within the corresponding circuit design.

In the emulation process described herein, prediction is performed such that a reset signal can be predicted with a multicycle path function. In one or more examples, the reset signal is generated by reset circuitry driven by clock signals (base clock signals). The base clock signals are generated from a driver clock signal. In such an example, the multicycle path function corresponds to the minimum of the multicycle path ratios provided by the frequency of the reset signal determined by the frequency of the fastest one of the base clock signals to the driver clock signal. The fastest base clock signal may be referred to as a primary clock signal. The multicycle properties enabled on the predicted reset signal paths ease the timing closure for the corresponding circuit designs and reducing glitches (e.g., errors) that occur during emulation, or prototyping, of the corresponding circuit design.

The reset signal prediction method described herein uses prediction within the corresponding reset logic cones such that multicycle paths can be applied to the reset logic cones (e.g., reset circuitry) and corresponding reset signals, mitigating glitches that occur during emulation, or prototyping, of the corresponding circuit design. A reset logic cone is a cone of logic that includes the logic (e.g., circuit elements) of a circuit design that generate a reset signal for a sequential circuit element (e.g., a circuit element that receives the reset signal). For example, the reset logic cone may include one or more flip-flops, latches, gate logic elements, and/or multiplexers (MUXs), among others of the circuit design. In one or more examples, the reset logic cone includes logic of one or more integrated circuits (ICs).

In some examples, prediction on the clock logic cone (e.g., the circuit elements that provide a clock signal or signal) is used to apply multicycle paths to data path logic, and clock logic cones, but not to the reset logic cones. In such examples, the reset logic cones act as performance bottlenecks within the emulation process as the reset logic cones are evaluated within a single cycle of the driver clock signal. Further in such cases, since the stable value of the reset signal is not predicted, glitches may occur in the path of the reset signal. Glitches may result in unintended design state changes. Further, direct evaluation of the reset logic cone allows glitches in the corresponding cones to propagate to the reset pin of the sequential circuit element, causing an unintended state change by the sequential circuit element.

Technical advantages of the present disclosure include, but are not limited to, applying prediction to reset logic cone (e.g., reset circuitry) to reduce the amount of processing time used for emulation, or prototyping, resulting in higher emulation or prototyping performance of the corresponding circuit design, and reducing glitches that generate unintended design state changes that occur during the emulation, or prototyping, of the corresponding circuit design.

FIG. 1 illustrates a circuit design 100, according to one or more examples. As illustrated in FIG. 1, the circuit design 100 includes a circuit element 110 and a reset circuitry (e.g., reset logic cone) 120. The circuit design 100 of FIG. 1 is one example of a circuit design and is not meant to be limiting in any way. The circuit element 110 is a flip-flop or a latch, among others. The circuit element 110 is connected to the output of the reset circuitry 120. Accordingly, the circuit element 110 is a sequential circuit element for the reset circuitry 120.

The circuit element 110 includes a data input pin (D) that receives a data signal 112, and an output pin (Q) that outputs the signal 114. Further, the circuit element receives the clock signal 116 via a clock input pin, and the reset signal 130 via a reset input pin.

The reset signal 130 is generated and output by the reset circuitry 120. The reset circuitry 120 includes one or more circuit elements. For example, the reset circuitry 120 includes one or more flip-flops, latches, and/or gate logic elements, among others. In one example, the reset circuitry 120 may be referred to a reset logic cone.

The reset signal 130 is generated and output by the reset circuitry 120. The reset circuitry 120 includes one or more circuit elements. For example, the reset circuitry 120 includes one or more flip-flops, latches, and/or gate logic elements, among others. In one example, the reset circuitry 120 may be referred to a reset logic cone.

The reset circuitry 120 receives the clock signals 122, 124, the data signal 126, and the reset signal 128. The reset circuitry 120 generates the reset signal 130 based on the clock signals 122, 124, the data signal 126, and the reset signal 128. For example, the state (assertion or de-assertion) of the reset signal 130 is based on the state of the clock signals 122, 124, the data signal 126, and the reset signal 128. In one example, the reset signal 130 is asserted (e.g., has a logic value of 1 or a high voltage value) based on the reset signal 128 being asserted and a positive (rising) edge of the clock signals 122 and 124. Further, in one example, the reset signal 130 is de-asserted (e.g., has a logic value of 0 or a low voltage value) based on the reset signal 128 being de-asserted, and a positive edge of the clock signals 122 and 124.

In one example, asserting the reset signal 130, transitions the reset signal 130 to a logic value of 1 (e.g., a high voltage value) from a logic value of 0 (e.g., a low voltage value). Further, de-asserting the reset signal 130, transitions the reset signal 130 to a logic value of 0 from a logic value of 1.

In one or more examples, during emulation of the circuit design 100, prediction is used to predict a future (next) value of the reset signal 130 (e.g., the value Reset_next). In one example, the future value of the reset signal 130 is based on the clock signals 122 and 124.

To determine the future value of the reset signal 130, in one or more examples, an auxiliary circuit is created such that at a rising edge of the clock signals 122 and 124, a future value of reset signal 130 (e.g., the value Reset_next) is predicted. In one example, a future value of the reset signal 130 is determined based on the future value of the clock signals 122 and 124. In one example, the future value of the reset signal 130 changes when the future value of the clock signals 122 and 124 have a positive edge. For example, the future value of the reset signal 130 changes from a logic value of 0 to a logic value 1 or from a logic value of 1 to a logic value of 0 based on a positive edge of the clock signals 122 and 124.

In one or more examples, when predicting the value of the reset signal 130, the output value of each circuit element (primitive) of the corresponding reset circuitry 120 (e.g., reset logic cone) is predicted. For each circuit element of the reset circuitry 120, a prediction expression is used to determine a corresponding predicted output value. The prediction expression or expressions for each circuit element are chained together to determine the predicted value of the reset signal. For example, to determine a predicted (e.g., future) value of the reset signal 130, the predicted output value of each of the circuit elements of the reset circuitry 120 are determined based on a corresponding local formula.

In one or more examples, when performing the prediction process, reset circuitry is determined to be a combinational circuit that propagates within one period of a root clock signal (e.g., a driver clock signal). A reset logic cone propagates within one period of the root clock signal as the circuit elements within the reset logic cone generate output signals that are generated and consumed at rising edges of the root clock signal.

To predict the value of the reset signal 130, prediction is completed with respect to the common driver clock signal (e.g., common root clock signal) and the prediction expression for each circuit element of the reset circuitry 120. In one example, the reset circuitry 120 includes a flipflop with a reset. For such a flipflop, if the value at the reset input is one, then the output signal Q of the flipflop has a value of zero. If the value of the reset is zero, the output signal Q of the flipflop is the value of the data signal D. Stated another way, a flipflop that receives clock signal CK, a reset signal R, and a data signal D, and outputs the output signal Q, is predicted based on expression 1. The clock signal CK is slower than the driver clock signal. Further, the clock signal CK transitions (e.g., has positive edges and negative edges) at each positive edge or at each negative edge of the drive clock signal. The positive and negative edges of the driver clock signal are referred to as transition edges. In Expression 1, if the value of the reset signal R is going to rise (e.g., a rising edge), the output value of the flipflop is zero, otherwise, the output value of the flipflop is D.

always@(posedge $CK$ or posedge $R$)

if $(R)Q<=0$; else $Q<=d$;

assign $Q\_next=(R\_next)?0:((CK\_next\ \&\ \sim CK)?D:Q)$    Expression 1

Further, a latch of the reset circuitry 120 that receives the clock signal CK and the data signal D, and outputs the output signal Q, is predicted based on expression 2. For a latch, if the reset signal is going to rise (e.g., a rising edge), the predicted output value (Q next) of the latch is zero, or if the next value of clock signal CK (e.g., CK_next) is going to rise (e.g., a rising edge), the output value of the latch is D_next. Otherwise, the output value of the output signal of the latch does not change.

always latch if $(R)Q<=0$; else if $(CK)Q<=D$;

assign $Q\_next=(R\_next)?0:((CK\_next)?D\_next:Q)$    Expression 2

A generated clock signal can be predicted from a driver clock signal (e.g., root clock signal or emulation clock signal) based on expression 3.

always@(posedge driver_clock)$C<=C\_next$    Expression 3

Each circuit element within the reset circuitry has a corresponding prediction expression that may be used to predict the future value of the reset signal 130. The prediction expression for a circuit element may be dependent on the predicted value of a previous circuit element and/or the predicted value of the circuit element may be used by another circuit element within the circuit design.

With reference to FIG. 1, the predicted value of the reset signal 130 (Reset) is Reset_Next. The reset signal 130 is a function of the clock signals 122 and 124 (e.g., clock signal C1 and C2, respectively). The clock signals 122 and 124 are periodic clock signals of the circuit design 100. The clock signals 122 and 124 may be referred to as secondary clock signal. While not illustrated in FIG. 1, the circuit design 100 includes one or more additional clock signals that are used to drive other circuit elements. For example, the circuit design 100 includes the clock signal CK. The clock signal CK is the fastest clock signal in the emulation system. The clock signal CK may be referred to as the primary clock signal. In one example, the clock signals C1 and C2 are generated from circuit elements of the circuit design 100 that are driven by the clock signal CK. The frequency of the clock signal CK is at least twice the frequency of the clock signals 122 and 124 such that the clock signal CK is at least twice as fast as the clock signals 122 and 124. Accordingly, the clock signals 122 and 124 can be remodeled based on the clock signal CK. Remodeling the clock signals 122 and 124 based on the clock signal CK, aligns voltage transitions (e.g., positive (rising) and negative (falling) edges) of the clock signals 122, and 124 with rising edges of the clock signal CK. Further, as is noted above, the positive and negative edges of the clock signal CK are aligned with the positive or negative edges of the driver clock signal, and the driver clock signal is faster than the clock signal CK, and all other clock signals of the circuit design.

Figure 2:
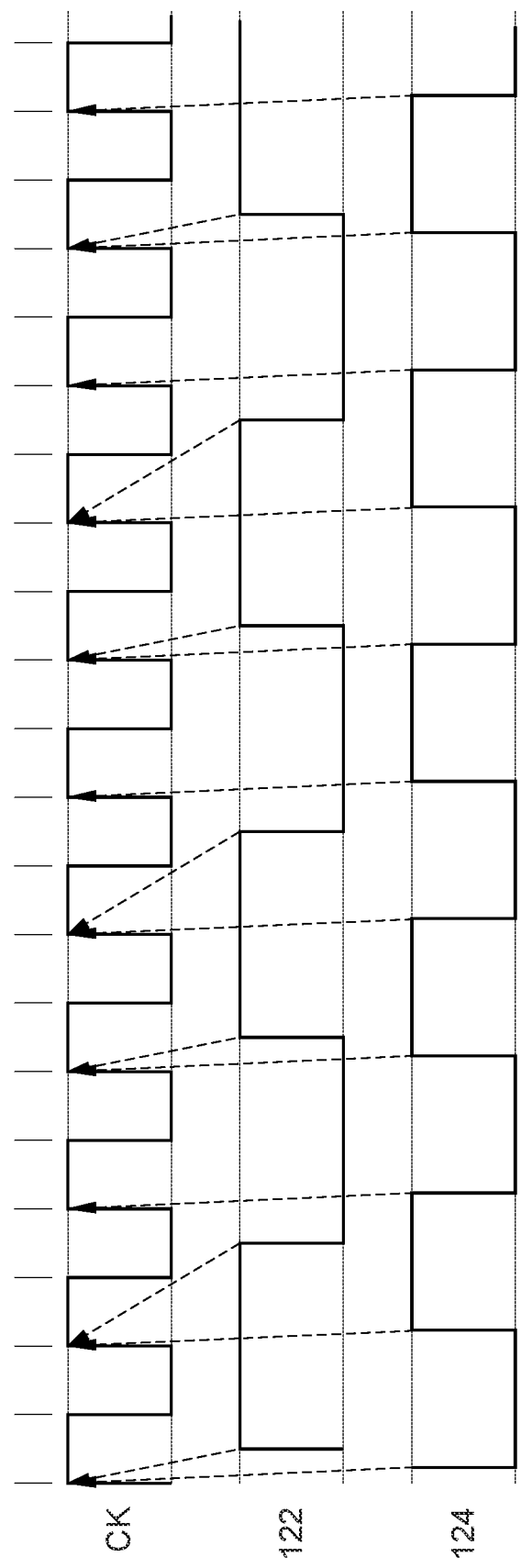
FIG. 2 illustrates a timing diagram of remodeling clock signals based on a faster clock signal in accordance with some embodiments of the present disclosure.

FIG. 2 illustrates an example where the positive and negative edges of the clock signals 122 and 124 (e.g., the secondary clock signals) are aligned with positive edges of the clock signal CK (e.g., the primary clock signal). At the negative edges of the clock signal CK, there are no transitions of the clock signals 122 and 124. While FIG. 2 illustrates remodeling a secondary clock signal (e.g., clock signal 122 and 124) to be aligned with positive edges of the primary clock signal (e.g., the clock signal CK), in other examples, a secondary clock signal is remodeled to be aligned with negative edges of the primary clock signal. The positive edges and negative edges may be referred to as transition edges.

Remodeling the clock signals 122 and 124 based on transition edges (e.g., positive edges or negative edges) of the clock signal CK, increases the corresponding prediction period, improving the emulation and prediction process of the circuit elements of the reset circuitry 120. As the clock signals 122 and 124 are remodeled based on the clock signal CK, the reset signal 130 is predicted based on the clock signal CK.

In one example, the clock signal 122 is generated by a flipflop F1 that is driven based on positive edges of the clock signal CK. Further, a data input and/or enable input of the flipflop F1 are also driven based on positive edges of the clock signal CK. The clock signal 122 is constrained based on the positive edges of the clock signal CK. Further, in one example, a flipflop F0 is a data predecessor of the flipflop F1, such that the data signal provided to the flipflop F1 is provided by the output of the flipflop F0. The flipflop F0 is driven based on positive edges of the clock signal CK. Accordingly, both of the flip-flops F1 and F0 are in the clock domain of the clock signal CK.

As is noted above, the clock signals 122 and 124 are remodeled based on the clock signal CK. Further, the reset signal 130 is a function of the clock signals 122, 124. For example, "reset signal 130=function (clock signals 122, 124)". Expression 4 illustrates syntax of the circuit element 110 in an example where the circuit element 110 is a flipflop, and the clock signal 116 (clock signal clk) is remodeled based on the clock signal CK, which is generated based on the driver clock signal (clock signal driver_clock).

always@(posedge driver_clock)

clk<=~clk;

always@(posedge clk or posedge Reset)//FF if (Reset)q<=0;

else q<=d;   Expression 4

As illustrated in the expression 4, at each positive edge of the driver clock signal, the clock signal clk (e.g., the clock signal 116) transitions (e.g., a positive edge or a negative edge occurs). Further, at each edge of the clock signal clk or at each edge of the reset signal 130 (Reset), if the reset signal 130 is asserted (e.g., a logic value of 1), the output of the circuit element 110 is a logic value of 0. However, if the reset signal 130 is not asserted (e.g., a logic value of 0), the output of the circuit element 110 is the data signal 112.

As is noted above, the reset signal 130 is a function of the clock signals 122 and 124. Accordingly, the reset signal 130 changes in value (e.g., from a logic value of 1 to a logic value of 0, or from a logic value of 0 to a logic value of 1) based on a positive edge of the clock signals 122 and 124. As the clock signals 122 and 124 (second clock signal) are remodeled based on the clock signal CK (primary clock signal), the clock signals 122 and 124 change in value based on positive edges or negative edges of the clock signal CK. Accordingly, a period of the clock signals 122 and 124 is at least two periods of the clock signal CK.

In one example, as is noted above, the clock signal CK is generated based on a driver clock signal. Accordingly, the origin of the clock signal CK is the driver clock signal. Further, at each positive edge of the driver clock signal, the value of the clock signal CK transitions, such that the clock signal CK transitions on positive edges of the driver clock signal. A period of the clock signal CK is at least two periods (e.g., cycles) of the driver clock signal.

As the clock signals 122 and 124 are remodeled based on rising edges of the clock signal CK, and the reset signal 130 is generated based on the clock signals 122 and 124, the predicted value (Reset_next) of the reset signal 130 is generated with respect to a positive edge of the clock signal CK. Expression 5 describes the relationship between the reset signal 130 and the clock signal CK. The predicted value Reset_next is a predicted value of the reset signal (e.g., the reset signal 130) with respect to a positive edge of the clock signal CK. As is illustrated by expression 5, the reset signal 130 is synchronized to positive edges of the clock signal CK. In expression 5, the reset signal 130 has a source that is driven by the clock signal CK.

always@(posedge CK)

Reset<=Reset_next   Expression 5

As is described in expression 5, at each positive edge of the clock signal CK, the value of the reset signal 130 changes. For example, each positive edge of the clock signal CK, the value of the reset signal 130 (e.g., reset signal reset) is the next value of the reset signal 130 (e.g., Reset_next). Accordingly, if a positive edge of the clock signal CK does not occur, the value of the reset signal 130 does not change.

The number of periods of the clock signal CK associated with the propagation of the reset signal 130 corresponds to the relationship between the clock signals 122 and 124 and the clock signal CK. For example, if the clock signal CK is $2^N$ times as fast as the clock signals 122 and 124, the propagation of the reset signal 130 corresponds to $2^N/2$ periods of the clock signal CK, where N is one or more.

In an example where the reset circuitry 120 includes flipflop F0 and flipflop F1 as described above, the predicted value of the reset signal 130 corresponds to a future value of the flipflop F1, which starts at the future value of the flipflop F0. In one example, to predict the output value of flipflop F1, the output value of the flipflop F0 is predicted.

Expression 6 describes the functionality of the circuit element 110 that is driven with the clock signal clk (e.g., clock signal 116) and receives the reset signal Reset (e.g., reset signal 130).

always@(posedge clk or posedge Reset)//FF if (Reset)q<=0;

else q<=d;   Expression 6

In expression 7, at each positive edge of the clock signal CK or at each positive edge of the reset signal 130 (e.g. reset signal Reset), if the value of the reset signal 130 is high (e.g., has a logic value of 1), the output of the circuit element 110 is 0. Else, the output of the circuit element 110 is the data signal 112.

Further, as the clock signal CK is remodeled based on the driver clock signal, the circuit element 110 can be remodeled as indicated by expression 7 and based on the driver clock signal (e.g., driver clock). While expression 7 is based on the positive edges of the driver clock signal, in other examples, negative edges of the driver clock signal may be used.

always@(posedge driver_clock)

if ((pos_CK & Reset_next)|(~pos_CK & Reset))

q<=0;

else if (clk_next & ~clk)

q<=d;   Expression 7

In expression 7, as the clock signal CK is remodeled based on the driver clock signal (e.g., clock signal driver_clock), the circuit element 110 is remodeled based on the driver clock signal. Further, in expression 7, the clock signal clk is the input clock signal (the clock signal 116) of the circuit element 110 of FIG. 1. The value Reset_next is predicted based on the clock signal CK. As is illustrated expression 7, at each positive edge of the driver clock signal (e.g., posedge_driver_clock), the predicted value of the reset signal (Reset_next) is used for emulation when there is a positive edge of the clock signal CK (e.g., pos_CK).

In expression 7, at each positive edge of the driver clock signal, the stable value of the reset signal 130 is used. For example, at each positive edge of the driver clock signal, and based on a positive edge of the clock signal CK and the value Reset_next being a logic value of 1, the output of the circuit element 110 is 0. Further, at each positive edge of the driver clock signal, and based on a positive edge of the clock signal CK not occurring, and the value Reset being a logic value of 1, the output of the circuit element 110 is 0. Else, at each positive edge of the driver clock signal, if there is no positive edge of the clock signal clk, the output of the circuit element 110 is the data signal 112.

In one example, the predicted value of the reset signal 130 is propagated during a previous positive edge of the clock signal CK, and is ready during the next positive edge of the clock signal CK. In one example, the prediction cone associated with the reset signal 130 is at least one period of the clock signal CK, and at least two periods of the driver clock signal.

In one or more examples, for a cycle of the driver clock signal where there is not a positive edge of the clock signal CK, the predicted value of the reset signal 130 is not used. The predicted value of the reset signal 130 is used when the clock signal CK has a positive value. The clock signal CK functions as a guard for the circuit element 110. The value of the reset signal 130 and/or the predicted value of the reset signal 130 is ignored unless a positive value of the clock signal CK occurs. As the predicted value of the reset signal 130 is used based on the occurrence of a positive edge of the clock signal CK, the predicted value is not used until the value of the reset signal 130 settles, and the current value (non-predicted value) of the reset signal 130 is used. If the value of the reset signal 130 is used when a positive edge of the reset signal 130 does not occur, the value of the reset signal 130 may not be settled and errors may be introduced. In the above description, while positive edges are described, in other examples, negative edges of the clock signal CK may be used.

Figure 8:
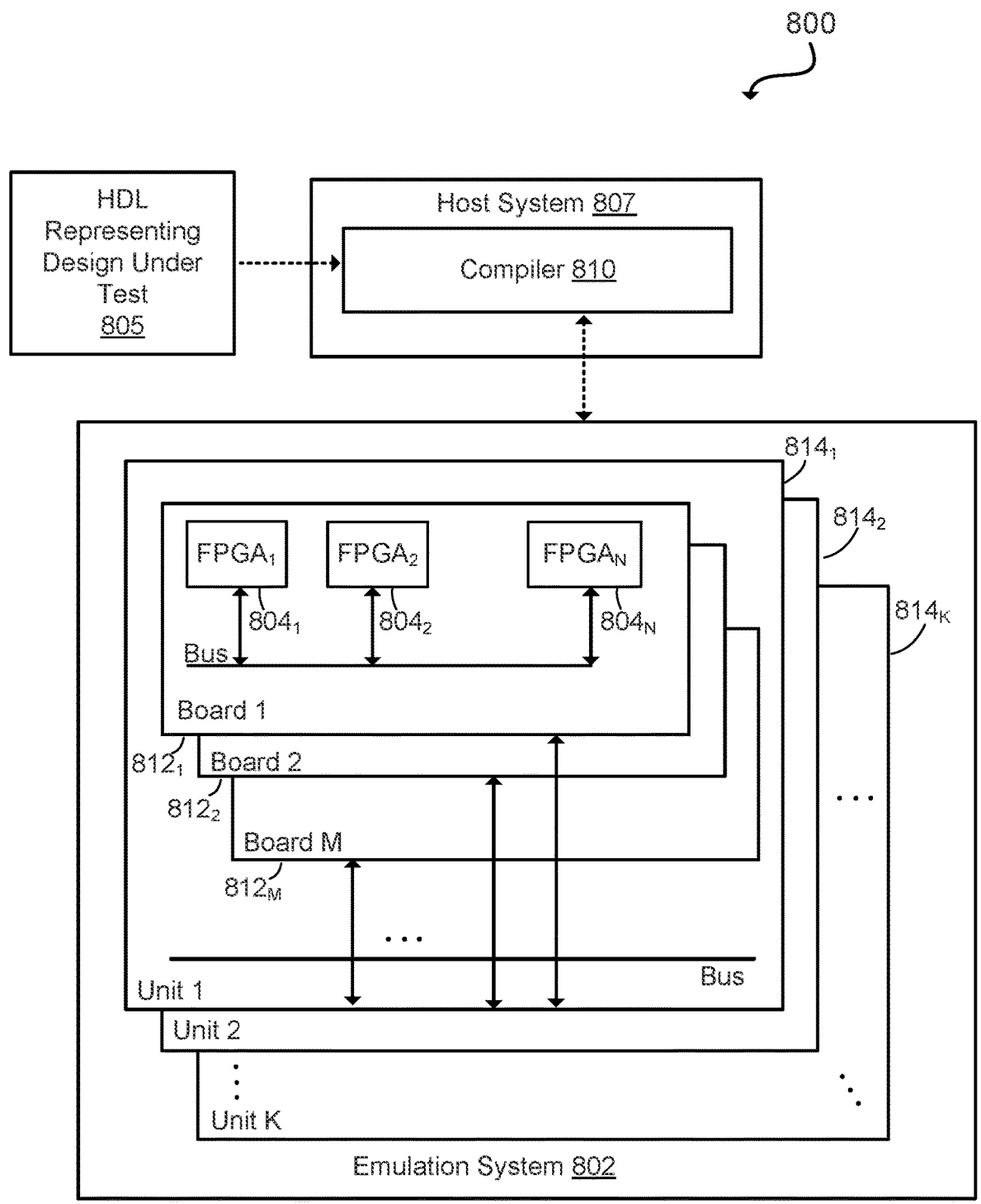
FIG. 8 depicts a diagram of an example emulation system in accordance with some embodiments of the present disclosure.

In one example, the circuit design 100 is emulated using one or more integrated circuits (ICs). For example, a first portion of the circuit design 100 is emulated using a first IC and a second portion of the circuit design 100 is emulated using a second IC. The ICs may be field programmable gate arrays (FPGAs) or application specific ICs (ASICS), among others. For example, as is illustrated in FIG. 8, an IC is an FPGA 804. Further, the ICs may be referred to as processors. During emulation of the circuit design 100, each IC maintains a local clock signal CK (local primary clock signal) and a local value pos_CK autonomously from each other IC. A predicted reset signal is generated for each IC based on local clock signal CK of each IC. Accordingly, the propagation path for the value Reset_next is generated via a multicycle path (e.g., propagates for multiple cycles of the local clock signal CK), while the propagation path of the value pos_CK is a single cycle path. However, the propagation path of the value pos_CK is not a bottleneck, and does not reduce emulation performance, as the value pos_CK is locally maintained (e.g., fully confined within an IC). In an example where the reset circuitry (e.g., the reset logic cone) crosses two or more ICs, when each IC maintains a local value pos_CK, the value Reset_next is generated via a multicycle path even when the reset circuitry is based on clock signals which have a frequency that is less than that of the driver clock signal.

In one example, the circuit design 100 includes one or more integrated circuits (ICs). For example, a first portion of the circuit design 100 is implemented on a first IC and a second portion of the circuit design 100 is implemented on a second IC. In one example, at least a portion of the reset circuitry 120 is disposed within a first IC and the circuit element 110 is disposed within a second IC. In one example, if the path associated with the reset signal 130 cross between ICs, the path is more timing expensive. However, by letting the path propagate for two cycles of the driver clock signal, and then the value of the reset signal 130 is read, the reset signal 130 is stabilized. However, if the value of the reset signal 130 is read at one cycle of the driver clock signal, the value of the reset signal 130 is incorrect, as the reset signal 130 has not had a chance to stabilize. For example, as the clock signal CK rises in the current cycle of the driver clock signal, the clock signal CK does not rise in the next cycle of the driver clock signal. Accordingly, there value of the reset signal 130 has not stabilized, and the value of the reset signal 130 is incorrect. Further, each IC generates a positive edge of the clock signal CK in unison, or at least during an overlapping period of time, such that in each IC, there is a positive edge of the clock signal CK during the same cycle of the driver clock signal.

Figure 3:
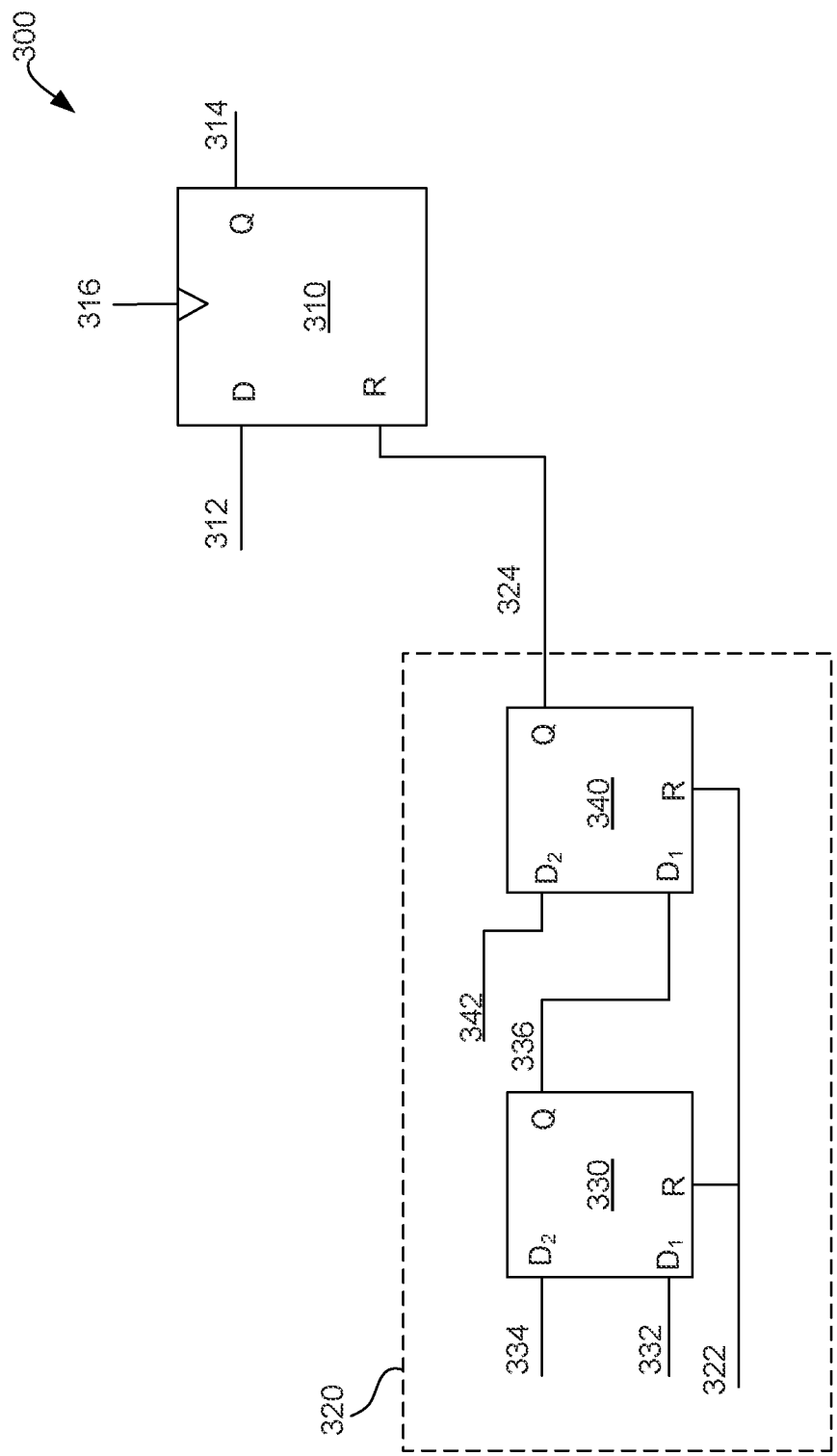
FIG. 3 illustrates a circuit design having a sequential circuit element driven by a reset signal of a reset circuitry in accordance with some embodiments of the present disclosure.

FIG. 3 illustrates a portion of a circuit design 300, according to one or more examples. As illustrated in FIG. 3, the circuit design 300 includes circuit element 310 and reset circuitry (e.g., reset signal circuitry) 320. The reset circuitry 320 includes circuit elements 330 and 340. The reset circuitry 320 is one example of reset circuitry, and is not meant to be limiting in any way. In other examples, the reset circuitry 320 includes a different combination of circuit elements (e.g., flip-flops, latches, and/or logic gates, among others) that generate a reset signal.

In the example of FIG. 3, the circuit element 310 is a flip-flop and the circuit elements 330, and 340 are latches. However, in other examples, other combinations of circuit elements (e.g., flip-flops, latches, and logic gates, among others) may be used.

The circuit element 310 includes a data input pin (D) that receives a data signal 312, and an output pin (Q) that outputs an output signal 314. Further, the circuit element receives the clock signal 116 via a clock input pin, and the reset signal 324 via a reset input pin.

The reset signal 324 is generated by the reset circuitry 320. The reset circuitry 320 includes the circuit element 330, and the circuit element 340. The reset circuitry 320 drives the reset signal 324 onto the sequential circuit element 110.

The circuit element 330 receives the data signal 332 at a first data input pin ($D_1$) and the clock signal 334 at a second data input pin ($D_2$), and outputs an output signal 336 via the output pin (Q). The circuit element 330 further receives the reset signal 322 via a set input pin (S).

The circuit element 330 receives the signal 336 at a first data input pin ($D_1$), a clock signal 342 at a second data input pin ($D_2$), and outputs the reset signal 324 via the output pin (Q). The circuit element 340 further receives the reset signal 322 via a set input pin (S).

In one example, asserting and deasserting the reset signal 322, also asserts and de-asserts the reset signal 324. If the reset is active high, asserting the reset signal 322 or 324, transitions the reset signal 322 or 324 to a logic value of 1 (e.g., a high voltage value) from a logic value of 0 (e.g., a low voltage value). Deasserting the active low reset signal 322 or 324, transitions the reset signal 322 or 324 to a logic value of 0 from a logic value of 1. If the reset is active low, asserting the reset signal 322 or 324, transitions the reset signal 322 or 324 to a logic value of 0 (e.g., a low voltage value) from a logic value of 1 (e.g., a high voltage value). De-asserting the active low reset signal 322 or 324, transitions the reset signal 322 or 324 to a logic value of 1 from a logic value of 0.

In one or more examples, the reset signal 324 is asserted based on the assertion of the reset signal 322. The reset signal 322 resets the circuit elements 330 and 340 when the reset signal 322 is asserted. The voltage transitions (e.g., positive edge or negative edge) of the clock signal 334 and 342 does not affect whether or not the circuit elements 330 or 340 are reset when the reset signal 322 is asserted. Accordingly, the reset signal 324 is asserted when the reset signal 322 is asserted.

When the reset signal 322 is de-asserted, the reset signal 324 is de-asserted. However, in contrast to the reset signal 324 being asserted when the reset signal 322 is asserted, the reset signal 324 is not de-asserted until a positive (e.g., rising) edge of the clock signal 334 and the clock signal 342 occur. Accordingly, the reset signal 324 may not de-assert until a period of time after the reset signal 322 is de-asserted.

The following example expression, expression 8, describes an example where a reset signal R2 (e.g., the reset signal 324 of FIG. 3) is asynchronously driven onto a sequential circuit element (e.g., the circuit element 310 of FIG. 3). The process of asserting the reset R2, which is changing the value of R2 from 0 to 1 so that the flop Q is reset, but the process of de-asserting R2, which is changing the value of R2 from 1 to 0, so that the flop Q is reset, is synchronous to clock C.

> always@(posedge C1 or posedge R)
>
> if $(R)R1<=1$; else $R1<=0$;
>
> always@(posedge C2 or posedge R)
>
> if $(R)R2<=1$; else $R2<=R1$;
>
> always@(posedge C or posedge R2)
>
> if $(R2)Q<=0$; else $Q<=D$        Expression 8

In expression 8, the reset signal R corresponds to the reset signal 322 of FIG. 3, reset signal R1 corresponds to the signal 336, clock signal C1 corresponds to the clock signal 334, clock signal C2 corresponds to the clock signal 342, and the clock signal C corresponds to the clock signal 316. Further, in expression 1, at each positive edge of the clock signal C1 (clock signal 334) or reset signal R (reset signal 322), the reset signal R1 (signal 336) has a logic value of 1, else, the signal R1 has a logic value of 0. Further, at each positive edge of the clock signal C2 (clock signal 342) or the reset signal R (reset signal 322), the reset signal R2 (reset signal 324) has a logic value of 1, else, the reset signal R2 is the reset signal R1. At positive edge of the clock signal C (clock signal 316) or positive edge of the reset signal R2, the output of the sequential circuit element (e.g., the circuit element 310) is a logic value of 0, else, the output is the data signal 312.

In one or more examples, prediction is applied to the reset circuitry 320. Accordingly, multicycle paths can be applied to the reset circuitry 320, mitigating glitches when evaluating the reset signal 324. In one or more examples, prediction is applied to the reset circuitry 320 to predict the de-assertion of the reset signal 324 (e.g., reset signal R2 of expression 8), mitigating glitches that occur when de-asserting the reset signal 324. Further, prediction is be applied to the assertion of the reset signal 324 by aligning the reset signal 324 with positive edges of the clock signal 316, or a clock signal (e.g., a driver clock signal or reference clock signal) that is used to derive the clock signal 316.

In one example, the reset circuitry 320 asynchronously drives the reset signal 324 with reference to the clock signal 316 or a reference clock signal (e.g., the driver clock signal). The clock signal 316 (the clock signal C), the clock signal 334 (the clock signal C1), and the clock signal 342 (the clock signal C2) are generated from and synchronous to a driver clock signal (e.g., an emulation signal). The driver clock signal defines the time unit of the emulation, or prototyping, process.

In one or more examples, the clock signals 316, 334, and 342 are grouped into one or more of K groups. K is one or more. The clock signals 316, 334, and 342 are grouped based on the ratio of the frequency of the clock signals 316, 334, and 342 to the frequency of the driver clock signal. The clock signals 316, 334, and 342 are derived based on the driver clock signal. The positive edges and negative edges of the clock signals 316, 334, and 342 are mapped to positive edges of the driver clock signal or another clock signal derived from the driver clock signal. The frequency of each of the clock signals 316, 334, and 342 corresponds the group that each of the clock signals are grouped. Further, the clock signals 316, 334, and 342 have a period that is equal to driver_clock*f(K), where f is the positive monotonically increasing function of K. Mapping the positive and negative edges of the clock signals 316, 334, and 342 allows the use of multicycle path functionality with the clock signals 316, 334, and 342. Accordingly, in examples where the assertion of the reset signal 324 is aligned to positive edges of the driver clock signal, or a clock signal derived from the driver clock signal, multicycle path functions are applied to the assertion of the reset signal 324.

As illustrated in FIG. 3, the reset signal 322 is input to the reset circuitry 320, and the reset signal 324 is output from the reset circuitry 320. In other examples, the reset circuitry 320 may receive multiple input reset signals and/or output multiple reset signals. In an example where a reset circuitry 320 outputs multiple reset signals, a separate portion of the reset circuitry is generated for every output reset signal by considering the circuit elements of the reset circuitry from the input to each output be a separate portion of the reset circuitry and predict different portions in parallel.

The reset signal 128 can be a hard reset signal or a soft reset. In an example when the reset signal 128 is a hard reset signal, the assertion of the reset signal 128 is asynchronous with the driver clock signal (e.g., emulation signal) and hence cannot be timed with respect to the emulation driver clock, and de-assertion of the reset signal 128 is synchronous with the emulation signal. As is noted above, in one example, assertion of the reset signal 324 corresponds to a transition from a logic value of 0 to a logic value of 1. In one example, assertion of the reset signal 324 is a change in value of the reset signal 322 that leads to a corresponding change of the reset signal 324, which causes the circuit element 310 (e.g., the sequential circuit element) to be reset. Further, as is noted above, de-assertion of the reset signal 322 is a change of value of the reset signal 322 that leads to a corresponding change of the reset signal 324, which causes the circuit element 310 to exit reset.

In an example where the reset signal 322 is a soft reset signal, the assertion of the reset signal 322 is synchronous to the driver clock signal, and de-assertion of the reset signal 322 is synchronous with a clock signal (e.g., the driver clock signal or a clock signal generated from the driver clock signal). In such an example, de-assertion of the reset signal 322 is predicted by aligning the de-assertion of the reset signal 322 with positive edges of the driver clock signal. In one example, the reset signal 322 (e.g., reset signal R of expression 8) is a soft reset and synchronous with a clock signal (e.g., a driver clock signal or a clock signal generated from the driver clock signal), and the de-assertion of the reset signal 322 is synchronous with the clock signal. In such an example, expression 8 can be predicted as shown in expression 9.

> always@(posedge driver_clock)
>
> if $(R)Q<=0$;
>
> else if (posedge_det(C) & (~R2_next))$Q<=D$;     Expression 9

As shown in expression 9, the reset signal R2 (e.g., the reset signal 324) is predicted based on the driver clock signal (e.g., driver clock signal). For example, the value R2_next is the value of the clock signal R2 calculated one cycle of the driver clock signal in advance. Accordingly, during the emulation process, de-assertion of the clock signal R2 is known before the de-assertion occurs, and this a-priori knowledge of occurrence of the de-assertion edge ensures that the circuit design comes out of reset without the occurrence of a glitch. In one or more examples, the clock signal C1 and C2, as illustrated in expression 2, are aligned with the driver clock signal (e.g., the emulation signal). For example, positive and negative edges of the clock signals C1 and C2 are mapped to rising edges of the driver clock signal. As the clock signal C1 and C2 are aligned to the driver clock signal, the value R2_next for the reset signal R2 can be predicted. Further, in expression 9, the value posedge_det (C) is the predicted value of the position edge of clock signal C. The value posedge_det(C) is an expression that goes high one cycle of the driver clock signal before the positive edge of the clock signal C occurs.

Predicting the value R2_next ensures that the assertion of the reset signal R (the reset signal 322) has the time equivalent period of the driver clock signal to propagate as the output value Q (the output 314). Further, the period of the de-assertion of the reset signal R corresponds to the minimum of the period of the clock signals C1 and C2. Accordingly, multicycle path functions can be applied to the de-assertion of the reset signal R.

In an example where the reset signal R is a hard reset, the expression 8 is predicted as shown in expression 10.

always@(posedge driver_clock or posedge $R$)

if $(R)Q<=0;$ else if (posedge_det($C$) & (~$R2$_next))$Q<=D;$   Expression 10

As is shown in expression 10, the value of the reset signal R2 is a logic value 0 based on a positive edge of the driver clock signal or positive edge of the reset signal R. The value of the reset signal R2 is a low logic value 1 based on a positive edge of the clock signal C and the value R2_next is positive. Accordingly, multicycle path functions are applied to the de-assertion edge as there is minimum of the period C1, C2, and C.

With further reference to FIG. 3, the circuit element 310 is illustrated as being a flip-flop (e.g., an edge triggered sequential circuit element), however, in one example, the circuit element 110 may be a latch (e.g., a level triggered sequential circuit element). The expression 11 describes the functionality of the circuit element 310 and corresponding circuitry in an example where the circuit element 310 is a latch.

always latch if $(R2)Q<=0;$ else if $(C)Q<=D$   Expression 11

Applying prediction to the reset signal R2 replaces the value R2_next with the value R2_sampled. The value R2_sampled is R_next sampled on the next negative edge of the driver clock signal. Further, the detected value of clock signal C, posedge_det(C) is replaced with the value C_sampled. The value C_sampled is the value of the clock signal C sampled on the next negative edge of the driver clock signal.

In one or more examples, the reset signal R (e.g., the reset signal 322) is generated based on a clock signal (e.g., the clock signal C3) that is grouped based on the ratio of the frequency of the clock signal with reference to the driver clock signal as described above with regard to clock signals C, C1 and C2. Positive and negative edges of clock signal are aligned with positive edges of the driver signal or a clock signal derived from the driver signal. Accordingly, positive and negative edges of the clock signal C3 are aligned with the rising edges of the driver clock signal. Further, in an example where the circuit element 310 is a latch, assertion of the reset signal 322 includes multicycle function path insertion that is based on the period of the clock signal C3. In an example where the reset signal R2, or any predecessor of the reset signal R2 (e.g., reset signal R1) or the reset signal R is generated based on the clock signal C of the sequential circuit element (e.g., the circuit element 310), reset of the circuit element 3 is synchronous with the clock signal C. In such an example, the reset operation can be considered to be a multiplexing arrangement at the data input of the circuit element 310 (e.g., a D-input of the flop-flop), where if the reset signal 324 is asserted, a value of zero is passed on to the D pin of the circuit element 310 instead of the data signal 312. Accordingly, the reset signal 324 is be moved into the data path and timed on the clock signal C (e.g., the clock signal 316). A similar transformation can be used if the clock signal C1, C2, or C3 has a group index of K1>K, where K is the group index based on the clock signal C, and the function f(K) is constructed both the positive edges and negative edges of the clock signal of the group K1 are aligned with positive edges of the reference clock signal for the corresponding group.

In one example, the circuit element 310 of FIG. 3 includes a set input and a reset input. In such an example, the circuit element 310 is a flip-flop (as shown) or a latch (not shown). Expression 12 describes the functionality of the circuit element 310 in such a situation.

always@(posedge $C1$ or posedge $R$)

if $(R)$ begin $R1<=1; R2<=1;$ end else begin $R1<=0; R2<=R1;$ end always@(posedge $C2$ or posedge $S$)

if $(R)$ begin $S1<=1; S2<=1;$ end else begin $S1<=0; S2<=S1;$ end always@(posedge $C$ or posedge $R2$ or posedge $S2$)

if $(R2)Q<=0;$ else if $(S2)Q<=1;$ else $Q<=D;$   Expression 12

In an example where the reset signal R is a soft reset, and S is a soft set, the value at the output Q can be predicted as illustrated in expression 13.

always@(posedge driver_clock)

if $(R)Q<=0;$ else if $(S)Q<=1;$ else if (posegde_det($C$) & (~$R2$_next) & (~$S2$_next))
$Q<=D;$   Expression 13

In expression 13, at each positive edge of the driver clock signal (e.g., driver_clock), the output of the sequential circuit element 310 is a logic value of 0 when a reset signal is asserted. Further, when the reset signal is de-asserted and the set signal is asserted, the output of the sequential circuit element 310 is a sequential circuit element 310 is a logic value of 1. When the a positive edge of the clock signal C is detected, the reset signal R2 is a asserted, and the set signal S2 is asserted, the output of the sequential circuit element 310 is the data signal 312.

If either of the reset signal R is a soft reset or the set signal S is a soft set, the value at the output of the sequential circuit element 310 is predicted as illustrated in expression 14.

always@(posedge driver_clock or posedge *R*)

if (*R*)*Q*<=0;

else if (*S*)*Q*<=1;

else if (posegde_det(*C*) & (~*R*2_next) & (~*S*2_next))

*Q*<=*D*;   Expression 14

In expression 14, at a positive edge of the driver clock signal or a positive edge of the reset signal R, the output 314 of the sequential circuit element 310 is a logic value of 0. When the set signal S is asserted, the output 314 of the sequential circuit element 310 is a logic value of 1. Further, based on the detection of a positive edge of the clock signal 316, the value R2_next being a logic value of 1, and the value S2_next being a logic value of 1, the output 314 of the sequential circuit element 310 is the data signal 312.

In or more examples, the emulation, prototyping process does not support sequential circuit elements that have a set input and reset input that can be handled asynchronously (e.g., the circuit element 310). In such an example, the corresponding prediction expression is represented as shown in expression 15 below. In expression 15, the reset logic cone and set logic cone, are configured as one or more MUXs. In the expression 15, both the reset signal R and the set signal S are a hard reset and hard set, respectively.

assign mux_in=*R*?0: *S*?1:posedge_det(*C*)?*D*:*Q*;

always@(posedge driver_clock) if (posegde_det(*C*)
  &

(~*R*2_next) & (~*S*2_next))*Q*1<=mux_in;

assign *Q*=*R*?0: *S*?1:*Q*1;   Expression 15

Figure 4:
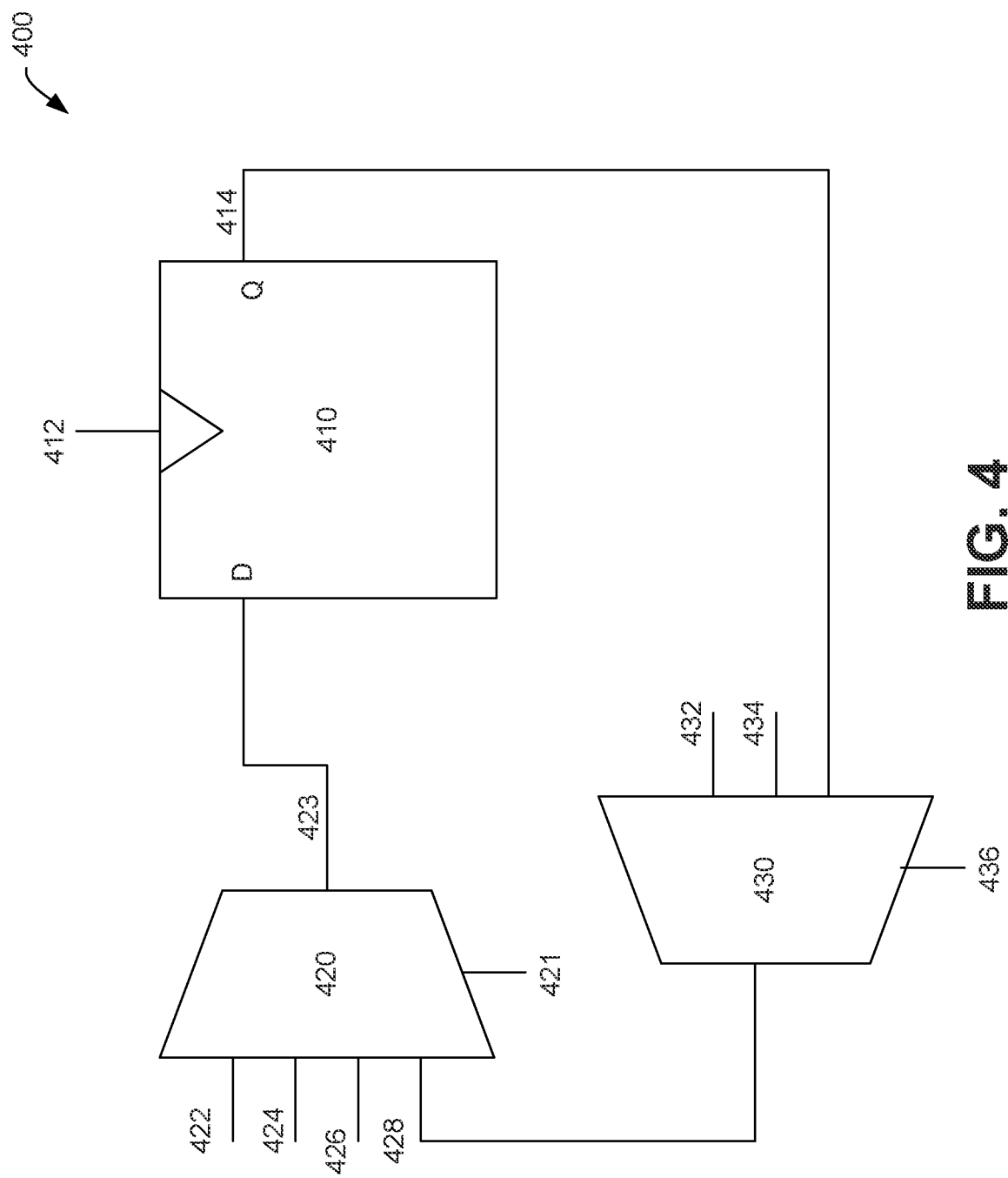
FIG. 4 illustrates a remodeled circuit design in accordance with some embodiments of the present disclosure.

FIG. 4 illustrates a logic representation of the expression 15 which is generated from the circuit design 300 of FIG. 3 in an example where the circuit element 310 includes both a rest pin and a set pin. In FIG. 4, the logic 400 includes a flip-flop 410 that has a set input and a reset input that are asynchronous with each other is represented as logic 400. The logic 400 includes a flip-flop 410, MUX 420, and MUX 430. The logic 400 is used to emulate, or prototype, a circuit element within a field programmable gate array (FPGA) based emulation, or prototype, system. For example, the logic 400 may be used by the emulation environment 800 of FIG. 8.

The flip-flop 410 has a D input that is connected to the output of the MUX 420, and an output Q that is connected to an input of the MUX 430. Further, the flip-flop 410 has a clock input that receives the clock signal 412.

The MUX 420 receives a signal 422 having a logic value of 0 at a first input, a signal 424 having a logic value of 1 at a second input, a data signal 426 at a third input, and a signal 428 at fourth input. The signal 428 is the output of the MUX 430. Further, the MUX 420 receives the select signal 421. The MUX 420 outputs one of the signal 422, 424, 426 and 428 as the signal 423 based on the select signal 421.

The select signal 421 is a two bit signal. The select signal 421 is generated based on the reset signal and set signal of original circuit element. When the reset signal has a logic value of 1, the value of the select signal 421 is 1, and the signal 422 is selected and output as the signal 423. When the reset signal has a logic value of 0, the set signal has a logic value 1, the select signal 421 has a value of 1 and the signal 424 is selected and output as the signal 423. Further, when the reset signal has a logic value of 0, the set signal has a logic value of 0, and a positive edge is detected on the clock signal 412, the select signal 421 has a value of 2. Based on the select signal 421 having a value of 2, the signal 426 is selected and output as the signal 423. Based on the reset signal having a logic value of 0, the set signal having a logic value of 0, and a positive edge not being detected on the clock signal 412, the select signal 421 has a value of 3, and the signal 428 is selected and output as the signal 423.

The MUX 430 receives the signal 432 at a first input. The signal 432 has a logic value of 0. A second input of the MUX 430 receives the signal 434. The signal 434 has a logic value of 1. A third input of the MUX 430 receives the output signal 414 of the flip-flop 410. The MUX 430 further receives a select signal 436. The select signal 436 is based on the reset signal and set signal of the corresponding circuit element. Based on the reset signal having a logic value 1, the select signal 436 has a logic value of 1, and the signal 432 is selected and output as the signal 428. Based on the reset signal having a logic value of 0, and the set signal having a logic value of 1, the signal 434 is selected and output as the signal 428. Based on the reset signal having a logic value of 0, and the set signal having a logic value of 0, the signal 414 is selected and output as the signal 428.

In one or more examples, the value written during a reset is variable. For example, with reference to FIG. 4, the value written to the flip-flop 410 is variable during reset. In such an example, a predicted value of the variable reset value is determined and used as the value of the signal 422 instead of a logic value of 0. Further, in an example, where the design clock signal C is stopped, and the driver clock signal is running, prediction of the reset variable value is not performed by block a reset from occurring when the design clock signal C is stopped.

Figure 5:
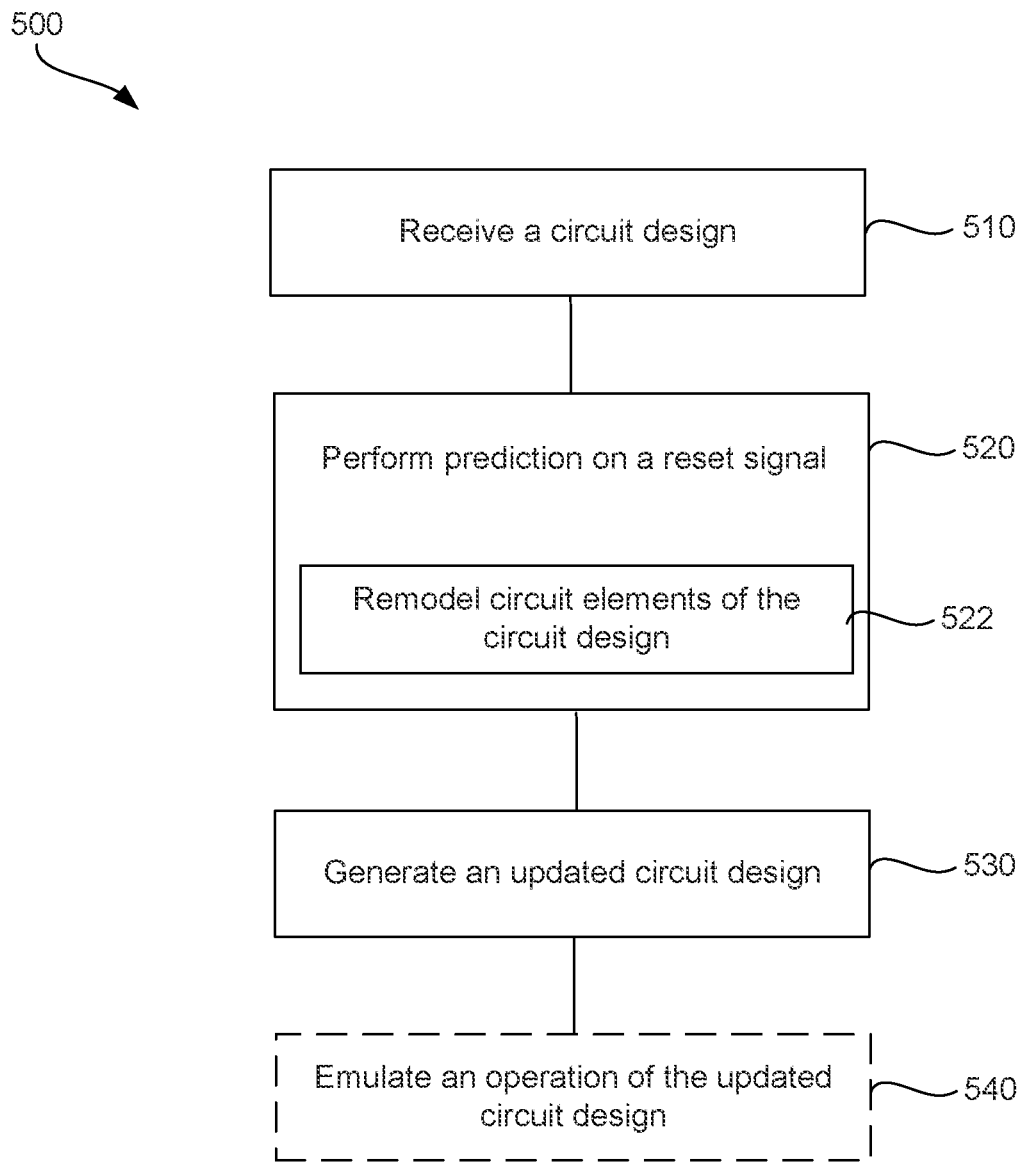
FIG. 5 illustrates a flowchart of a method for generating an updated circuit design based on the prediction of a reset signal in accordance with some embodiments of the present disclosure.

FIG. 5 illustrates a flowchart of a method 500 for predicting a value of a reset signal, according to one or more examples. The method 500 may be performed by a computer system (e.g., the computer system 900). In one example, the computer system is a circuit analysis system. In one or more examples, a processor (e.g., the processing device 902 of FIG. 9) executes one or more instructions (e.g., the instructions 926 of FIG. 9) stored in a memory (e.g., the main memory 904 of FIG. 9 or machine-readable storage medium 924 of FIG. 9) to perform the method 500. In one example, the method 500 is performed as part of the process logical design and functional verification 716 of FIG. 7.

At 510 of the method 500, a circuit design is received. For example, a circuit design is received from a memory (e.g., the main memory 904 of FIG. 9 and/or the machine-readable storage medium 924 of FIG. 8), or another system. The circuit design (e.g., the circuit design 100 of FIG. 1) includes one or more circuit elements (e.g., the circuit element 110 of FIG. 1) having a reset input driven by one or more reset signals generated by reset circuitry (e.g., the reset circuitry 120).

At 520 of the method 500, prediction is performed on a reset signal. With reference to FIG. 1, prediction is performed on the reset signal 130 generated by a reset circuitry 120. In one example, prediction is applied to the reset circuitry 120 to determine the value of the reset signal 130 based on a primary clock signal (e.g., clock signal CK), as is described above.

Performing prediction on the reset signal 130 includes, 522 of the method 500, remodeling the circuit elements of the circuit design 100. For example, the reset circuitry 120 is remodeled based on expression 6 as described above. In other examples, a circuit design is remodeled based on one or more of the expressions 9-15 as described above. In one example, the circuit elements of the reset circuitry 120 are driven based on the clock signals 122 and 124 (e.g., secondary clock signals). In such an example, the clock signals 122 and 124 are generated based on the clock signal CK (primary clock signal). Accordingly, as the clock signals 122 and 124 are at least twice as slow as the clock signal CK, the clock signals 122 and 124 are remodeled based on the clock signal CK. In such an example, the circuit elements of the reset circuitry 120 are remodeled based on the clock signal CK. Remodeling the clock signals 122 and 124 to be based on the clock signal CK includes remodeling the signals 122 and 124 at transition edges (e.g., positive edges or negative edges) of the clock signal CK as shown in FIG. 2. Remodeling the circuit elements of the reset circuitry 120 based on the clock signal CK, remodels the reset signal 130 to be based on the clock signal CK. Further, as the reset signal 130 is remodeled be based on the clock signal CK, and as the clock signal CK is generated based on the driver clock signal (e.g., at transition edges of the driver clock signal), the circuit element 110 is remodeled based on the driver clock signal. In one or more examples, based on remodeling the clock signals 122 and 124 based on transition edges of the clock signal CK, a predicted reset signal is generated subsequent to the reset signal at the transition edge of the clock signal CK.

At 530 of the method 500, an updated circuit design based on the remodeled circuit elements. The updated circuit design is stored in a memory (e.g., the main memory 904 of FIG. 9 and/or the machine-readable storage medium 924 of FIG. 9).

At 540 of the method 500, the updated circuit design is used by an emulation environment (e.g., the emulation environment 800 of FIG. 8) to emulate an operation of the updated circuit design. Emulating an operation of the updated circuit design includes emulating the updated circuit design based on the predicted reset signal, such that the predicted reset signal propagates through multiple cycles of the clock signal CK. In one example, at first transition edges (e.g., first ones of the positive edges or negative edges), the predictive reset signal (e.g., value Reset_next) is read and used during emulation, and at second transition edges (e.g., second ones of the positive edges or negative edges), the current reset signal is read and used during emulation. In one example, 540 of the method 500 is omitted from the method 500.

Figure 6:
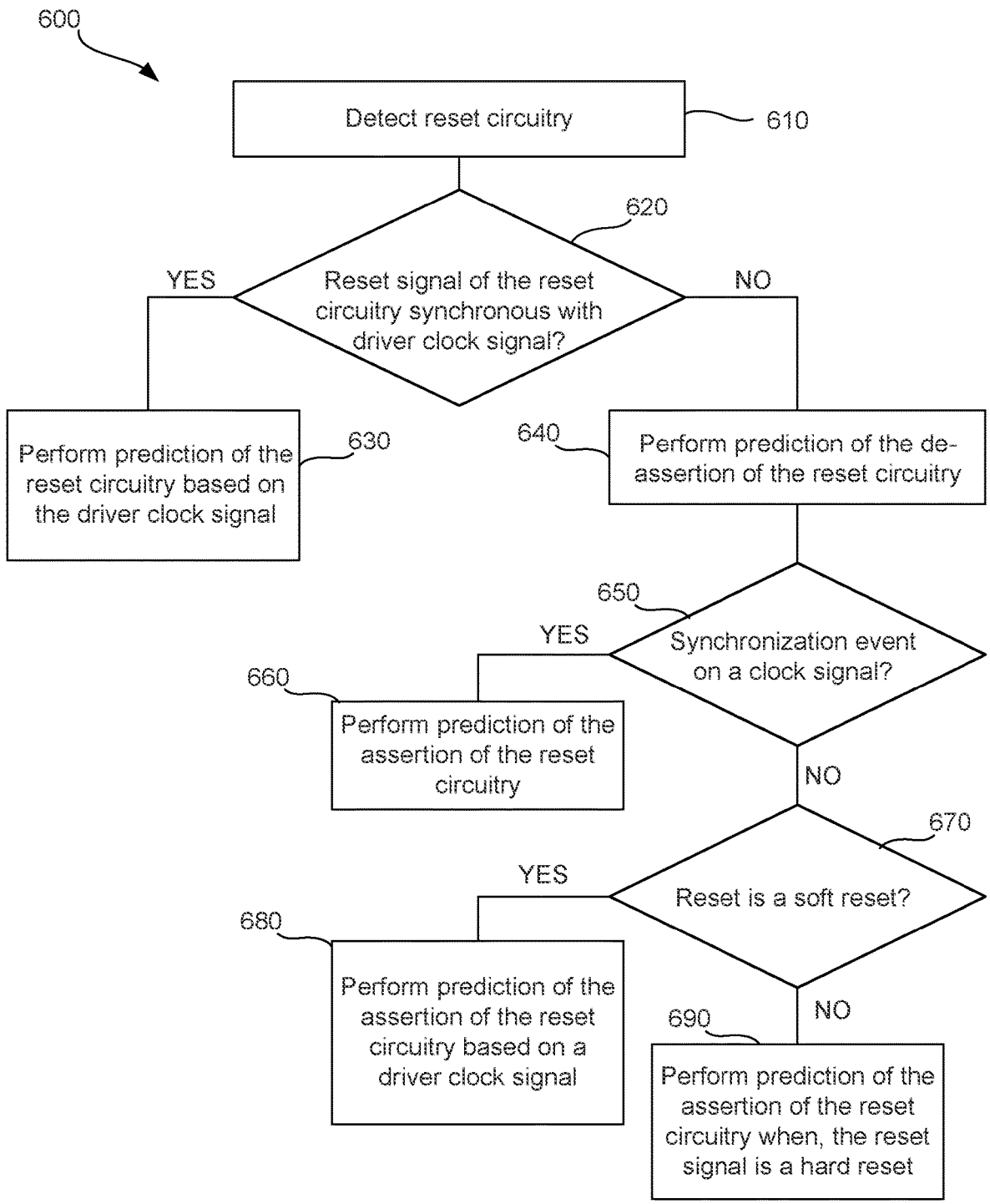
FIG. 6 illustrates a flowchart of a method for performing prediction on a reset signal in accordance with some embodiments of the present disclosure.

FIG. 6 illustrates a flowchart of a method 600 for performing prediction on a reset signal. The method 600 is performed by a computer system (e.g., the computer system 900 of FIG. 9). In one or more examples, a processor (e.g., the processing device 902 of FIG. 9) executes one or more instructions (e.g., the instructions 926 of FIG. 9) stored in a memory (e.g., the main memory 904 of FIG. 9 or machine-readable medium 924 of FIG. 9) to perform the method 600. The method 600 further describes 520 of the method 500. In one example, the method 600 is performed as part of the process logical design and functional verification 716 of FIG. 7.

At 610 of the method 600, a reset circuitry is detected. The reset circuitry (e.g., reset logic cone) is detected within a circuit design. A circuit design may include one or more reset circuitries that each produce one or more reset signals based on one or more input reset signals. In one example, the computer system 900 of FIG. 9 detects the reset circuitry 120 of FIG. 1 and stores the reset circuitry 120 in the main memory 904 of FIG. 9.

In one example, the reset circuitry of a circuit design is identified via tracing. For example, for a flipflop FF with a reset input that receives a reset signal, the reset signal of the flipflop FF is traced to identify the reset circuitry. In one example, if flipflop F1 generates the reset signal for the flipflop FF, the flipflop F1 is determined to be part of the reset circuitry. Further, each subsequent flipflop that generates a reset signal that is used in the generation of the reset signal flipflop F1 or and the clock signals of the flipflops are included within the reset circuitry. Further, once a flipflop (e.g., the flipflop F) that is in the reset circuitry is determined to be evaluated at a transition edge (e.g., a positive edge or negative edge) of a primary clock signal (e.g., clock signal CK), tracing stops, and the reset circuitry is determined to include the identified flipflops, and any gate logic and other circuit elements connected to the flipflops. In one example, the reset circuitry is determined to be synchronized to the primary clock signal, as the final flipflop (e.g., flipflop F) is evaluated at the positive edge (or negative edge) of the primary clock signal.

At 620 of the method 600, a determination as to whether or not a reset signal of the reset circuitry is synchronous with a driver clock signal (e.g., a reference clock signal or emulation signal) is determined. In another example, the reference clock signal is a clock signal that has positive and negative edges aligned with positive edges of the driver clock signal, and has a slower frequency than that of the emulation signal.

If, at 620 of the method 600, the reset signal is determined to be synchronous with the driver clock signal, prediction of the reset circuitry is performed based on the driver clock signal at 630 of the method 600. In an example where the reset signal is synchronized to a driver clock signal, both the assertion and de-assertion edge of the reset signal is predicted one driver clock in advance by determining the reset circuitry on a copy of the driver clock signal generated one driver clock signal cycle before. The predicted value of the reset signal is generated by the realigned reset signal.

If, at 620 of the method 600, the reset signal is determined to be not synchronous with the driver clock signal, prediction of the de-assertion cone of the reset circuitry (e.g., reset logic cone) is performed at 640 of the method 600. As de-assertion of the reset circuitry is synchronous with the driver clock signal, prediction of the de-assertion cone of the reset logic cone is performed based on the driver clock signal.

At 650 of the method 600, a determination is made whether the assertion edge of the reset signal is synchronized to any reference clock signal by checking, if at any point inside the reset circuitry, the circuit elements that generate the reset signals are not connected to any of the input asynchronous reset. If, at 650 of the method 600, a synchronization event is determined, prediction of the assertion of the reset signal of the reset logic cone is performed at 660 of the method 600. For example, prediction is performed on the assertion of the reset signal 130 of FIG. 1 is performed.

If, at 650 of the method 600, a synchronization event is not determined, a determination as to whether or not the reset is soft is determined at 670 of the method 600. If, at 670 of the method 600, the reset is determined to be soft, prediction is performed on the assertion of the reset signal based on the driver clock signal at 680 of the method 600. For example, as illustrated in expression 9, prediction is performed based on a positive edge of a clock signal of sequential circuit element and the next predicted value of the reset signal for every positive edge of the driver clock signal.

If, at 670 of the method 600, the reset is determined to be hard, prediction is performed on the assertion of the reset signal is untimed at 690 of the method 600. For example, as illustrated in expression 10, prediction is performed based on a positive edge of a clock signal of a sequential circuit element and the next predicted value of the reset signal for every positive edge of the driver clock signal or positive edge of an input reset signal for the reset logic.

Figure 7:
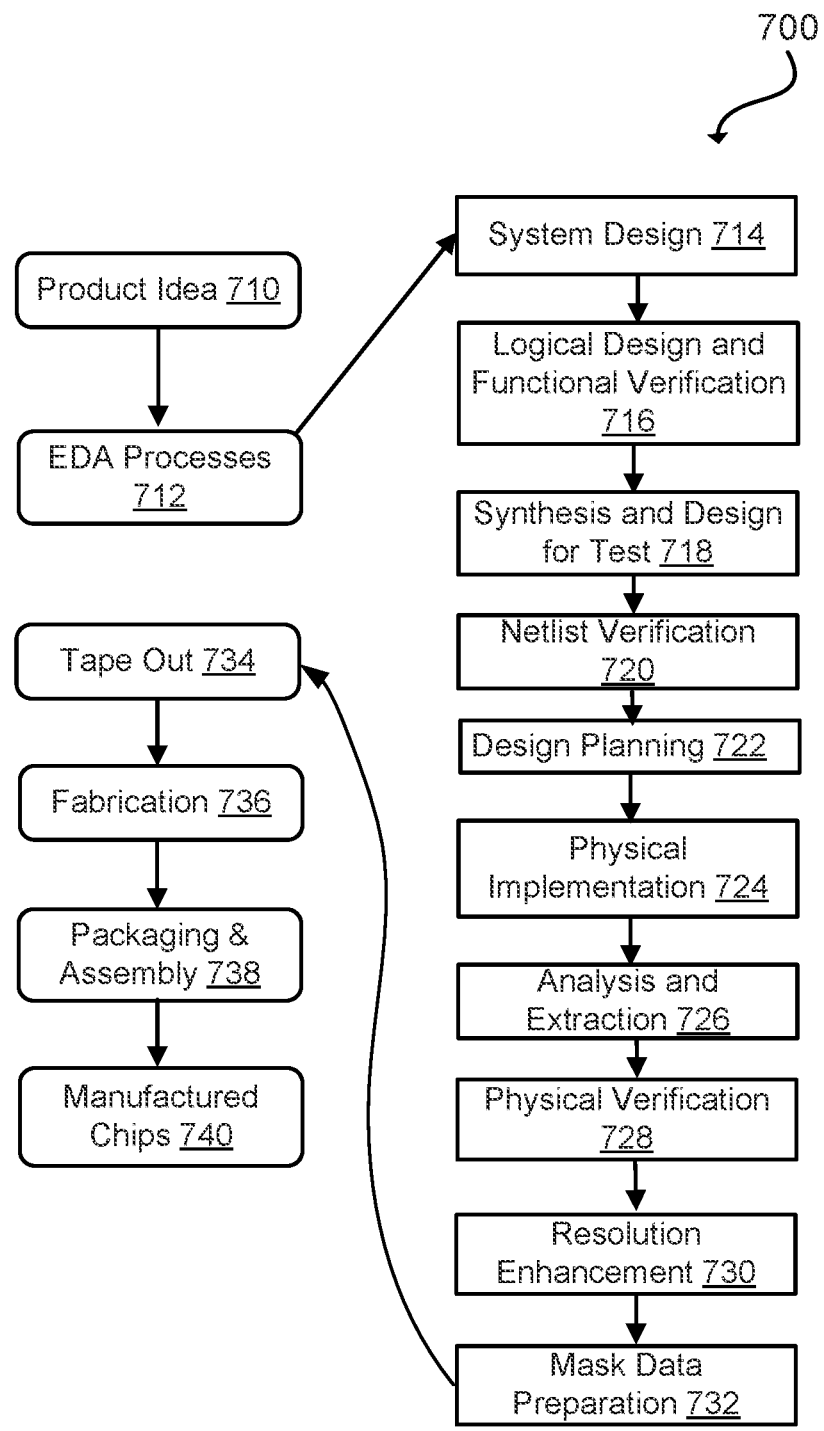
FIG. 7 depicts a flowchart of various processes used during the design and manufacture of an integrated circuit in accordance with some embodiments of the present disclosure.

FIG. 7 illustrates an example set of processes 700 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 710 with information supplied by a designer, information which is transformed to create an article of manufacture that uses a set of EDA processes 712. When the design is finalized, the design is taped-out 734, which is when artwork (e.g., geometric patterns) for the integrated circuit is sent to a fabrication facility to manufacture the mask set, which is then used to manufacture the integrated circuit. After tape-out, a semiconductor die is fabricated 736 and packaging and assembly processes 738 are performed to produce the finished integrated circuit 740.

Specifications for a circuit or electronic structure may range from low-level transistor material layouts to high-level description languages. A high-level of representation may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding systems of that layer (e.g., a formal verification system). A design process may use a sequence depicted in FIG. 7. The processes described by be enabled by EDA products (or EDA systems).

During system design 714, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 716, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 718, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 720, the netlist is checked for compliance with timing constraints and for correspondence with the HDL code. During design planning 722, an overall floor plan for the integrated circuit is constructed and analyzed for timing and top-level routing.

During layout or physical implementation 724, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 726, the circuit function is verified at the layout level, which permits refinement of the layout design. During physical verification 728, the layout design is checked to ensure that manufacturing constraints are correct, such as DRC constraints, electrical constraints, lithographic constraints, and that circuitry function matches the HDL design specification. During resolution enhancement 730, the geometry of the layout is transformed to improve how the circuit design is manufactured.

During tape-out, data is created to be used (after lithographic enhancements are applied if appropriate) for production of lithography masks. During mask data preparation 732, the 'tape-out' data is used to produce lithography masks that are used to produce finished integrated circuits.

A storage subsystem of a computer system (such as computer system 900 of FIG. 9, or host system 807 of FIG. 8) may be used to store the programs and data structures that are used by some or all of the EDA products described herein, and products used for development of cells for the library and for physical and logical design that use the library.

FIG. 8 depicts a diagram of an example emulation environment 800. An emulation environment 800 may be configured to verify the functionality of the circuit design. The emulation environment 800 may include a host system 807 (e.g., a computer that is part of an EDA system) and an emulation system 802 (e.g., a set of programmable devices such as Field Programmable Gate Arrays (FPGAs) or processors). The host system generates data and information by using a compiler 810 to structure the emulation system to emulate a circuit design. A circuit design to be emulated is also referred to as a Design Under Test ('DUT') where data and information from the emulation are used to verify the functionality of the DUT.

The host system 807 may include one or more processors. In the embodiment where the host system includes multiple processors, the functions described herein as being performed by the host system can be distributed among the multiple processors. The host system 807 may include a compiler 810 to transform specifications written in a description language that represents a DUT and to produce data (e.g., binary data) and information that is used to structure the emulation system 802 to emulate the DUT. The compiler 810 can transform, change, restructure, add new functions to, and/or control the timing of the DUT.

The host system 807 and emulation system 802 exchange data and information using signals carried by an emulation connection. The connection can be, but is not limited to, one or more electrical cables such as cables with pin structures compatible with the Recommended Standard 232 (RS232) or universal serial bus (USB) protocols. The connection can be a wired communication medium or network such as a local area network or a wide area network such as the Internet. The connection can be a wireless communication medium or a network with one or more points of access using a wireless protocol such as BLUETOOTH or IEEE 802.11. The host system 807 and emulation system 802 can exchange data and information through a third device such as a network server.

The emulation system 802 includes multiple FPGAs (or other modules) such as FPGAs $804_1$ and $804_2$ as well as additional FPGAs to $804_N$. Each FPGA can include one or more FPGA interfaces through which the FPGA is connected to other FPGAs (and potentially other emulation components) for the FPGAs to exchange signals. An FPGA interface can be referred to as an input/output pin or an FPGA pad. While an emulator may include FPGAs, embodiments of emulators can include other types of logic blocks instead of, or along with, the FPGAs for emulating DUTs. For example, the emulation system 802 can include custom FPGAs, specialized ASICs for emulation or prototyping, memories, and input/output devices.

A programmable device can include an array of programmable logic blocks and a hierarchy of interconnections that can enable the programmable logic blocks to be interconnected according to the descriptions in the HDL code. Each of the programmable logic blocks can enable complex combinational functions or enable logic gates such as AND, and XOR logic blocks. In some embodiments, the logic blocks also can include memory elements/devices, which can be simple latches, flip-flops, or other blocks of memory. Depending on the length of the interconnections between different logic blocks, signals can arrive at input terminals of the logic blocks at different times and thus may be temporarily stored in the memory elements/devices.

FPGAs $804_1$-$804_N$ may be placed onto one or more boards $812_1$ and $812_2$ as well as additional boards through $812_M$. Multiple boards can be placed into an emulation unit $814_1$. The boards within an emulation unit can be connected using the backplane of the emulation unit or any other types of connections. In addition, multiple emulation units (e.g., $814_1$ and $814_2$ through $814_K$) can be connected to each other by cables or any other means to form a multi-emulation unit system.

For a DUT that is to be emulated, the host system 807 transmits one or more bit files to the emulation system 802.

The bit files may specify a description of the DUT and may further specify partitions of the DUT created by the host system 807 with trace and injection logic, mappings of the partitions to the FPGAs of the emulator, and design constraints. Using the bit files, the emulator structures the FPGAs to perform the functions of the DUT. In some embodiments, one or more FPGAs of the emulators may have the trace and injection logic built into the silicon of the FPGA. In such an embodiment, the FPGAs may not be structured by the host system to emulate trace and injection logic.

The host system 807 receives a description of a DUT that is to be emulated. In some embodiments, the DUT description is in a description language (e.g., a register transfer language (RTL)). In some embodiments, the DUT description is in netlist level files or a mix of netlist level files and HDL files. If part of the DUT description or the entire DUT description is in an HDL, then the host system can synthesize the DUT description to create a gate level netlist using the DUT description. A host system can use the netlist of the DUT to partition the DUT into multiple partitions where one or more of the partitions include trace and injection logic. The trace and injection logic traces interface signals that are exchanged via the interfaces of an FPGA. Additionally, the trace and injection logic can inject traced interface signals into the logic of the FPGA. The host system maps each partition to an FPGA of the emulator. In some embodiments, the trace and injection logic is included in select partitions for a group of FPGAs. The trace and injection logic can be built into one or more of the FPGAs of an emulator. The host system can synthesize multiplexers to be mapped into the FPGAs. The multiplexers can be used by the trace and injection logic to inject interface signals into the DUT logic.

The host system creates bit files describing each partition of the DUT and the mapping of the partitions to the FPGAs. For partitions in which trace and injection logic are included, the bit files also describe the logic that is included. The bit files can include place and route information and design constraints. The host system stores the bit files and information describing which FPGAs are to emulate each component of the DUT (e.g., to which FPGAs each component is mapped).

Upon request, the host system transmits the bit files to the emulator. The host system signals the emulator to start the emulation of the DUT. During emulation of the DUT or at the end of the emulation, the host system receives emulation results from the emulator through the emulation connection. Emulation results are data and information generated by the emulator during the emulation of the DUT which include interface signals and states of interface signals that have been traced by the trace and injection logic of each FPGA. The host system can store the emulation results and/or transmits the emulation results to another processing system.

After emulation of the DUT, a circuit designer can request to debug a component of the DUT. If such a request is made, the circuit designer can specify a time period of the emulation to debug. The host system identifies which FPGAs are emulating the component using the stored information. The host system retrieves stored interface signals associated with the time period and traced by the trace and injection logic of each identified FPGA. The host system signals the emulator to re-emulate the identified FPGAs. The host system transmits the retrieved interface signals to the emulator to re-emulate the component for the specified time period. The trace and injection logic of each identified FPGA injects its respective interface signals received from the host system into the logic of the DUT mapped to the FPGA. In case of multiple re-emulations of an FPGA, merging the results produces a full debug view.

The host system receives, from the emulation system, signals traced by logic of the identified FPGAs during the re-emulation of the component. The host system stores the signals received from the emulator. The signals traced during the re-emulation can have a higher sampling rate than the sampling rate during the initial emulation. For example, in the initial emulation a traced signal can include a saved state of the component every X milliseconds. However, in the re-emulation the traced signal can include a saved state every Y milliseconds where Y is less than X. If the circuit designer requests to view a waveform of a signal traced during the re-emulation, the host system can retrieve the stored signal and display a plot of the signal. For example, the host system can generate a waveform of the signal. Afterwards, the circuit designer can request to re-emulate the same component for a different time period or to re-emulate another component.

A host system 807 and/or the compiler 810 may include sub-systems such as, but not limited to, a design synthesizer sub-system, a mapping sub-system, a run time sub-system, a results sub-system, a debug sub-system, a waveform sub-system, and a storage sub-system. The sub-systems can be structured and enabled as individual or multiple modules or two or more may be structured as a module. Together these sub-systems structure the emulator and monitor the emulation results.

The design synthesizer sub-system transforms the HDL that is representing a DUT 805 into gate level logic. For a DUT that is to be emulated, the design synthesizer sub-system receives a description of the DUT. If the description of the DUT is fully or partially in HDL (e.g., RTL or other level of representation), the design synthesizer sub-system synthesizes the HDL of the DUT to create a gate-level netlist with a description of the DUT in terms of gate level logic.

The mapping sub-system partitions DUTs and maps the partitions into emulator FPGAs. The mapping sub-system partitions a DUT at the gate level into a number of partitions using the netlist of the DUT. For each partition, the mapping sub-system retrieves a gate level description of the trace and injection logic and adds the logic to the partition. As described above, the trace and injection logic included in a partition is used to trace signals exchanged via the interfaces of an FPGA to which the partition is mapped (trace interface signals). The trace and injection logic can be added to the DUT prior to the partitioning. For example, the trace and injection logic can be added by the design synthesizer sub-system prior to or after the synthesizing the HDL of the DUT.

In addition to including the trace and injection logic, the mapping sub-system can include additional tracing logic in a partition to trace the states of certain DUT components that are not traced by the trace and injection. The mapping sub-system can include the additional tracing logic in the DUT prior to the partitioning or in partitions after the partitioning. The design synthesizer sub-system can include the additional tracing logic in an HDL description of the DUT prior to synthesizing the HDL description.

The mapping sub-system maps each partition of the DUT to an FPGA of the emulator. For partitioning and mapping, the mapping sub-system uses design rules, design constraints (e.g., timing or logic constraints), and information about the emulator. For components of the DUT, the mapping sub-system stores information in the storage sub-system describing which FPGAs are to emulate each component.

Using the partitioning and the mapping, the mapping sub-system generates one or more bit files that describe the created partitions and the mapping of logic to each FPGA of the emulator. The bit files can include additional information such as constraints of the DUT and routing information of connections between FPGAs and connections within each FPGA. The mapping sub-system can generate a bit file for each partition of the DUT and can store the bit file in the storage sub-system. Upon request from a circuit designer, the mapping sub-system transmits the bit files to the emulator, and the emulator can use the bit files to structure the FPGAs to emulate the DUT.

If the emulator includes specialized ASICs that include the trace and injection logic, the mapping sub-system can generate a specific structure that connects the specialized ASICs to the DUT. In some embodiments, the mapping sub-system can save the information of the traced/injected signal and where the information is stored on the specialized ASIC.

The run time sub-system controls emulations performed by the emulator. The run time sub-system can cause the emulator to start or stop executing an emulation. Additionally, the run time sub-system can provide input signals and data to the emulator. The input signals can be provided directly to the emulator through the connection or indirectly through other input signal devices. For example, the host system can control an input signal device to provide the input signals to the emulator. The input signal device can be, for example, a test board (directly or through cables), signal generator, another emulator, or another host system.

The results sub-system processes emulation results generated by the emulator. During emulation and/or after completing the emulation, the results sub-system receives emulation results from the emulator generated during the emulation. The emulation results include signals traced during the emulation. Specifically, the emulation results include interface signals traced by the trace and injection logic emulated by each FPGA and can include signals traced by additional logic included in the DUT. Each traced signal can span multiple cycles of the emulation. A traced signal includes multiple states and each state is associated with a time of the emulation. The results sub-system stores the traced signals in the storage sub-system. For each stored signal, the results sub-system can store information indicating which FPGA generated the traced signal.

The debug sub-system allows circuit designers to debug DUT components. After the emulator has emulated a DUT and the results sub-system has received the interface signals traced by the trace and injection logic during the emulation, a circuit designer can request to debug a component of the DUT by re-emulating the component for a specific time period. In a request to debug a component, the circuit designer identifies the component and indicates a time period of the emulation to debug. The circuit designer's request can include a sampling rate that indicates how often states of debugged components should be saved by logic that traces signals.

The debug sub-system identifies one or more FPGAs of the emulator that are emulating the component using the information stored by the mapping sub-system in the storage sub-system. For each identified FPGA, the debug sub-system retrieves, from the storage sub-system, interface signals traced by the trace and injection logic of the FPGA during the time period indicated by the circuit designer. For example, the debug sub-system retrieves states traced by the trace and injection logic that are associated with the time period.

The debug sub-system transmits the retrieved interface signals to the emulator. The debug sub-system instructs the debug sub-system to use the identified FPGAs and for the trace and injection logic of each identified FPGA to inject its respective traced signals into logic of the FPGA to re-emulate the component for the requested time period. The debug sub-system can further transmit the sampling rate provided by the circuit designer to the emulator so that the tracing logic traces states at the proper intervals.

To debug the component, the emulator can use the FPGAs to which the component has been mapped. Additionally, the re-emulation of the component can be performed at any point specified by the circuit designer.

For an identified FPGA, the debug sub-system can transmit instructions to the emulator to load multiple emulator FPGAs with the same configuration of the identified FPGA. The debug sub-system additionally signals the emulator to use the multiple FPGAs in parallel. Each FPGA from the multiple FPGAs is used with a different time window of the interface signals to generate a larger time window in a shorter amount of time. For example, the identified FPGA can require an hour or more to use a certain amount of cycles. However, if multiple FPGAs have the same data and structure of the identified FPGA and each of these FPGAs runs a subset of the cycles, the emulator can require a few minutes for the FPGAs to collectively use all the cycles.

A circuit designer can identify a hierarchy or a list of DUT signals to re-emulate. To enable this, the debug sub-system determines the FPGA needed to emulate the hierarchy or list of signals, retrieves the necessary interface signals, and transmits the retrieved interface signals to the emulator for re-emulation. Thus, a circuit designer can identify any element (e.g., component, device, or signal) of the DUT to debug/re-emulate.

The waveform sub-system generates waveforms using the traced signals. If a circuit designer requests to view a waveform of a signal traced during an emulation run, the host system retrieves the signal from the storage sub-system. The waveform sub-system displays a plot of the signal. For one or more signals, when the signals are received from the emulator, the waveform sub-system can automatically generate the plots of the signals.

Figure 9:
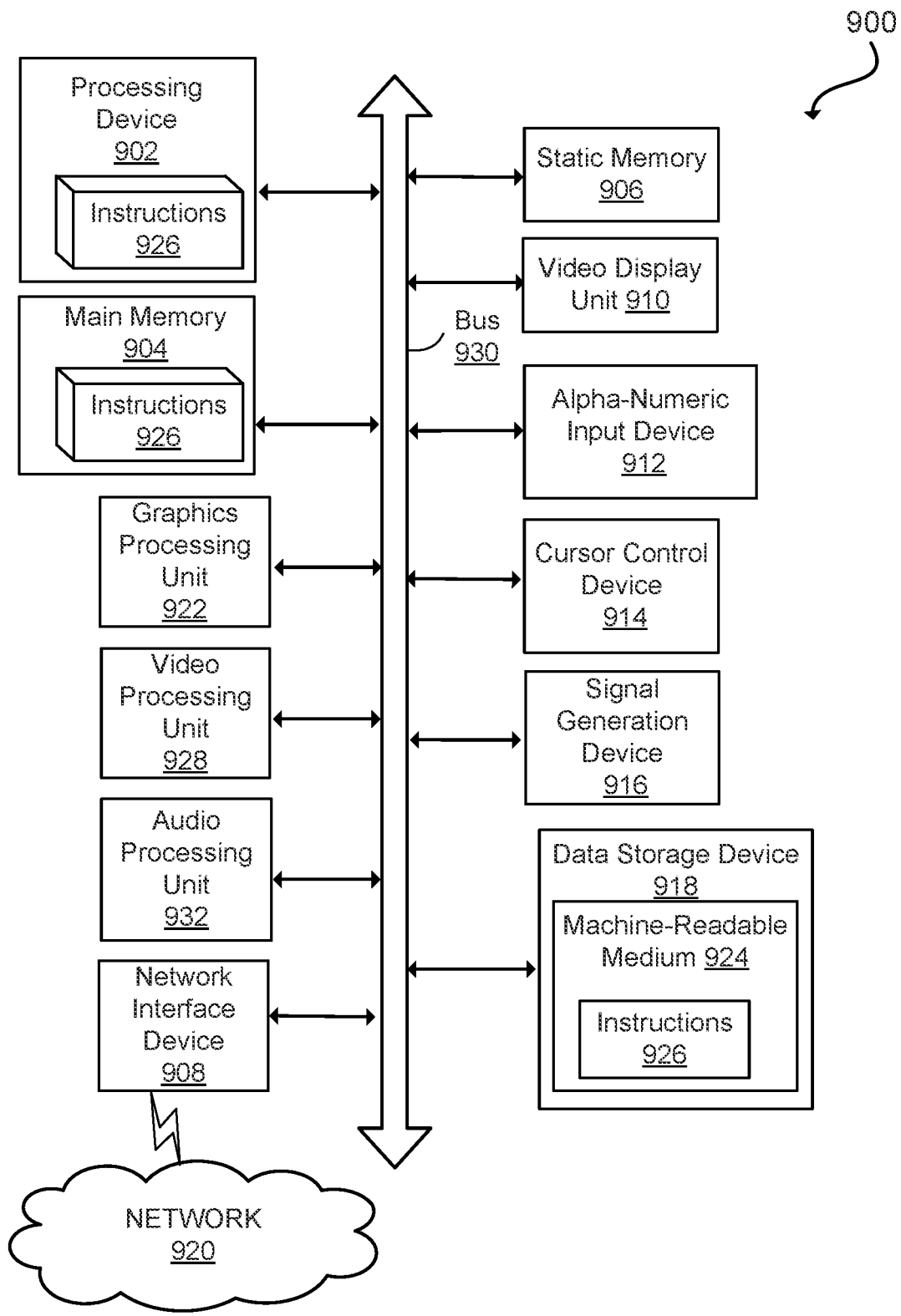
FIG. 9 depicts a diagram of an example computer system in which embodiments of the present disclosure may operate.

FIG. 9 illustrates an example machine of a computer system 900 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM), a static memory 906 (e.g., flash memory, static random access memory (SRAM), etc.), and a data storage device 918, which communicate with each other via a bus 930.

Processing device 902 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 may also be one or more special-purpose processing devices such as an application specific integrated circuit (ASIC), a field programmable gate array (FPGA), a digital signal processor (DSP), network processor, or the like. The processing device 902 may be configured to execute instructions 926 for performing the operations and steps described herein.

The computer system 900 may further include a network interface device 908 to communicate over the network 920. The computer system 900 also may include a video display unit 910 (e.g., a liquid crystal display (LCD) or a cathode ray tube (CRT)), an alphanumeric input device 912 (e.g., a keyboard), a cursor control device 914 (e.g., a mouse), a graphics processing unit 922, a signal generation device 916 (e.g., a speaker), graphics processing unit 922, video processing unit 928, and audio processing unit 932.

The data storage device 918 may include a machine-readable storage medium 924 (also known as a non-transitory computer-readable medium) on which is stored one or more sets of instructions 926 or software embodying any one or more of the methodologies or functions described herein. The instructions 926 may also reside, completely or at least partially, within the main memory 904 and/or within the processing device 902 during execution thereof by the computer system 900, the main memory 904 and the processing device 902 also constituting machine-readable storage media.

In some implementations, the instructions 926 include instructions to implement functionality corresponding to the present disclosure. While the machine-readable storage medium 924 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 902 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method, comprising:
    receiving a circuit design driven by a primary clock signal, the circuit design including reset circuitry and sequential circuitry connected to the reset circuitry,
        wherein the circuit design includes a secondary clock signal that is slower than the primary clock signal, and
        wherein the reset circuitry generates a reset signal that is a function of the secondary clock signal;
    remodeling the secondary clock signal at a transition edge of the primary clock signal;
    generating a predicted reset signal subsequent to the reset signal at the transition edge of the primary clock signal; and
    emulating an operation of the circuit design based on the predicted reset signal such that the predicted reset signal from the reset circuitry propagates through multiple cycles of the primary clock signal.

2. The method of claim 1, wherein positive edges and negative edges of the primary clock signal occur at a transition edge of a driver clock signal.

3. The method of claim 1, wherein the transition edge of the primary clock signal is a first one of a positive edge of the primary clock signal and a negative edge of the primary clock signal, wherein the method further comprises emulating the operation of the circuit design based on a current value of the reset signal based on a second one the positive edge of the primary clock signal and the negative edge of the primary clock signal.

4. The method of claim 1, wherein emulating the operation of the circuit design comprises using integrated circuits to emulate respective portions of the circuit design.

5. The method of claim 4, wherein each of the integrated circuits maintains a respective primary clock signal.

6. The method of claim 5, wherein generating the predicted reset signal subsequent to the reset signal at the transition edge of the primary clock signal comprises, for each of the integrated circuits, generating a respective predicted reset signal at an edge of each respective primary clock signal.

7. The method of claim 6, wherein, for each of the integrated circuits, the predicted reset signal propagates through multiple cycles of the respective primary clock signal.

8. A system comprising:
    a memory storing instructions; and
    a processor, coupled with the memory and to execute the instructions, the instructions when executed cause the processor to:
        receive a circuit design including reset circuitry and sequential circuitry connected to the reset circuitry, wherein the circuit design includes a secondary clock signal, and
            wherein the reset circuitry generates a reset signal that is a function of the secondary clock signal;
        remodel the secondary clock signal at a transition edge of primary clock signal, wherein the secondary clock signal is slower than the primary clock signal;
        generate a predicted reset signal subsequent to the reset signal at the transition edge of the primary clock signal; and
        emulate an operation of the circuit design based on the predicted reset signal such that the predicted reset signal from the reset circuitry propagates through multiple cycles of the primary clock signal.

9. The system of claim 8, wherein the circuit design is driven by the primary clock signal.

10. The system of claim 8, wherein the transition edge of the primary clock signal is a first one of a positive edge of the primary clock signal and a negative edge of the primary clock signal, wherein the processor is further configured to emulate the operation of the circuit design based on a current value of the reset signal based on a second one the positive edge of the primary clock signal and the negative edge of the primary clock signal.

11. The system of claim 8, wherein emulating the operation of the circuit design comprises using integrated circuits to emulate respective portions of the circuit design.

12. The system of claim 11, wherein each of the integrated circuits maintains a respective primary clock signal.

13. The system of claim 12, wherein generating the predicted reset signal subsequent to the reset signal at the transition edge of the primary clock signal comprises, for each of the integrated circuits, generating a respective predicted reset signal at an edge of each respective primary clock signal.

14. The system of claim 13, wherein, for each of the integrated circuits, the predicted reset signal propagates through multiple cycles of the respective primary clock signal.

15. An emulation system comprising:
a compiler configured to:
receive a circuit design including reset circuitry and sequential circuitry connected to the reset circuitry, wherein the circuit design includes a secondary clock signal, and
wherein the reset circuitry generates a reset signal that is a function of the secondary clock signal;
remodel the secondary clock signal at a transition edge of a primary clock signal, wherein the secondary clock signal is slower than the primary clock signal; and one or more processors configured to:
receive the circuit design including the remodeled secondary clock signal;
generate a predicted reset signal subsequent to the reset signal at the transition edge of the primary clock signal; and
emulate an operation of the circuit design based on the predicted reset signal such that the predicted reset signal from the reset circuitry propagates through multiple cycles of the primary clock signal.

16. The emulation system of claim 15, wherein the transition edge of the primary clock signal is a first one of a positive edge of the primary clock signal and a negative edge of the primary clock signal, wherein the one or more processors are further configured to emulate the operation of the circuit design based on a current value of the reset signal based on a second one the positive edge of the primary clock signal and the negative edge of the primary clock signal.

17. The emulation system of claim 15, wherein the one or more processors includes at least two processors, and wherein each of the at least two processors emulate a respective portion of the circuit design.

18. The emulation system of claim 17, wherein each of the at least two processors maintains a respective primary clock signal.

19. The emulation system of claim 17, wherein generating the predicted reset signal subsequent to the reset signal at the transition edge of the primary clock signal comprises, for each of at least two processors, generating a respective predicted reset signal at an edge of each respective primary clock signal.

20. The emulation system of claim 17, wherein, for each of the at least two processors, the predicted reset signal propagates through multiple cycles of the respective primary clock signal.

* * * * *